(12) United States Patent
Wang et al.

(10) Patent No.: US 12,268,045 B2
(45) Date of Patent: Apr. 1, 2025

(54) HOLE TRANSPORT MATERIAL, MANUFACTURING METHOD THEREOF, AND ELECTROLUMINESCENT DEVICE

(71) Applicant: WUHAN CHINA STAR OPTOELECTRONICS SEMICONDUCTOR DISPLAY TECHNOLOGY CO., LTD., Wuhan (CN)

(72) Inventors: Yanjie Wang, Wuhan (CN); Jiajia Luo, Wuhan (CN); Keyan Bai, Wuhan (CN)

( * ) Notice: Subject to any disclaimer, the term of this patent is extended or adjusted under 35 U.S.C. 154(b) by 693 days.

(21) Appl. No.: 17/274,190

(22) PCT Filed: Dec. 22, 2020

(86) PCT No.: PCT/CN2020/138351
§ 371 (c)(1),
(2) Date: Mar. 8, 2021

(87) PCT Pub. No.: WO2022/120945
PCT Pub. Date: Jun. 16, 2022

(65) Prior Publication Data
US 2023/0039370 A1    Feb. 9, 2023

(30) Foreign Application Priority Data
Dec. 8, 2020    (CN) .......................... 202011442468.8

(51) Int. Cl.
*H01L 51/50* (2006.01)
*H01L 51/00* (2006.01)
*H10K 50/15* (2023.01)
*H10K 85/60* (2023.01)

(52) U.S. Cl.
CPC .......... *H10K 50/15* (2023.02); *H10K 85/615* (2023.02); *H10K 85/624* (2023.02); *H10K 85/633* (2023.02); *H10K 85/657* (2023.02); *H10K 85/6574* (2023.02)

(58) Field of Classification Search
None
See application file for complete search history.

(56) References Cited

FOREIGN PATENT DOCUMENTS

| CN | 109574925 A | 4/2019 |
|---|---|---|
| CN | 109867652 A | 6/2019 |
| CN | 109912578 A | 6/2019 |
| CN | 109912592 A | 6/2019 |
| CN | 110049964 A | 7/2019 |
| CN | 110446702 A | 11/2019 |

(Continued)

OTHER PUBLICATIONS

Machine English translation of Tan et al. (CN 110746409 A). Apr. 30, 2024.*

*Primary Examiner* — Jay Yang

(57) ABSTRACT

A hole transport material, a manufacturing method thereof, and an electroluminescent device are provided. A main chain of a molecular structure of the hole transport material includes spiro aromatic amine, and a branch chain of the molecular structure of the hole transport material includes an aryl group or a heteroaryl group. The hole transport material can effectively improve performance of hole injection and hole transport, thereby balancing electrons and holes in electroluminescent devices and realizing relatively low voltage and relatively high efficiency.

14 Claims, 1 Drawing Sheet

(56) References Cited

FOREIGN PATENT DOCUMENTS

| | | | |
|---|---|---|---|
| CN | 110551135 A | | 12/2019 |
| CN | 110746409 A | * | 2/2020 |
| CN | 110785401 A | | 2/2020 |
| CN | 111057005 A | | 4/2020 |
| CN | 111253332 A | | 6/2020 |
| CN | 111479799 A | | 7/2020 |
| KR | 20130140303 A | | 12/2013 |
| KR | 20190088030 A | | 7/2019 |
| KR | 20190103790 A | | 9/2019 |
| KR | 20200016498 A | | 2/2020 |
| WO | 2020166875 A1 | | 8/2020 |

* cited by examiner

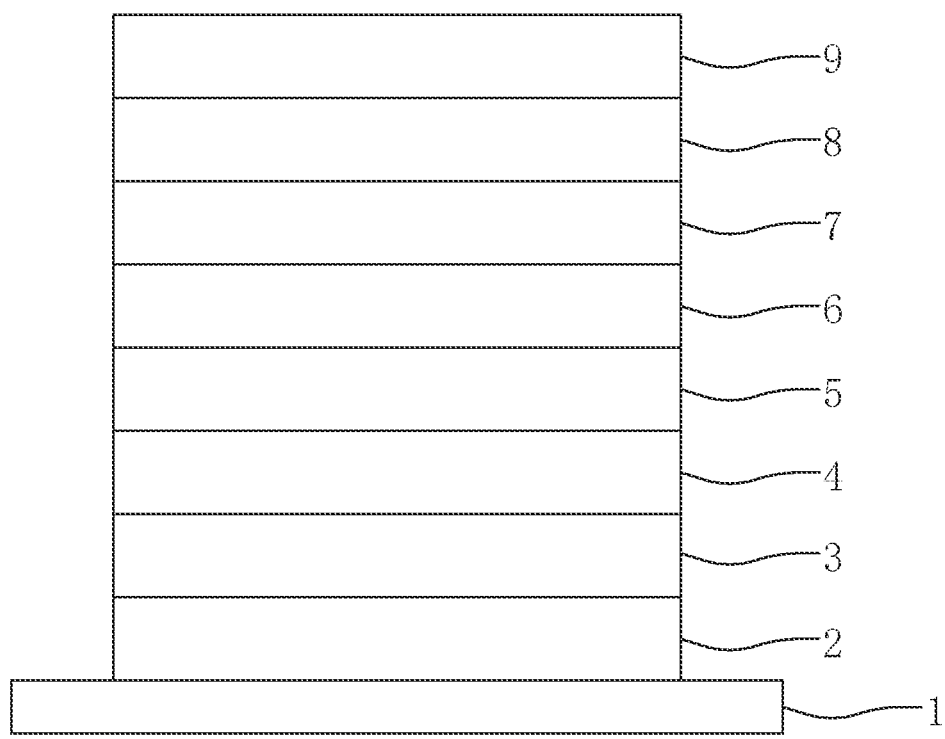

HOLE TRANSPORT MATERIAL, MANUFACTURING METHOD THEREOF, AND ELECTROLUMINESCENT DEVICE

FIELD OF INVENTION

The present disclosure relates to the field of display technologies, and more particularly, to a hole transport material, a manufacturing method thereof, and an electroluminescent device.

BACKGROUND OF INVENTION

Organic electrical devices, which are formed of an anode, a cathode, and an organic layer disposed therebetween, include organic light-emitting diodes (OLEDs), organic solar batteries, organic semiconductors, and organic crystals. A working principle of the OLEDs is: an external voltage is applied to an electrode, thereby injecting holes and electrons into an organic layer to form excitons. Therefore, the OLEDs may emit light. A working principle of the organic solar cells is: external light is absorbed by organic materials to form excitons. Then, the excitons are separated into holes and electrons which are transported to an electrode to be stored.

The organic layer of the organic electrical devices includes a single layer or multiple layers of organic materials such as a hole injection/transport material, an electron injection/transport material, or a luminescent material. The above-mentioned organic materials have similar functions even though they are used in different organic electrical devices.

The OLEDs may convert electrical energy into photon energy. Typically, a structure of the OLEDs includes an anode, a cathode, and an organic material layer disposed therebetween. The organic material layer may be classified as a hole injection material, a hole transport material, an electron injection material, an electron transport material, or a luminescent material according to its functions. In addition, the luminescent material may be classified into a blue luminescent material, a sky blue luminescent material, a green luminescent material, a yellow luminescent material, a red luminescent material, or a deep red luminescent material according to a color of light emitted by the luminescent material.

The OLEDs are mainly evaluated according to voltage, efficiency, and lifetime thereof. As a result, developing electroluminescent devices with low voltage, high efficiency, and long lifetime is a target that is continuously pursued by people in research and development and business fields. To achieve the target, electron/hole injection/transport materials with high mobility, high efficiency luminescent materials, and effective balance between electrons and holes in devices are necessary. Furthermore, because the organic materials need to be mass-produced, an evaporation method (sublimation or melting), dissolving temperature, glass transition temperature, and outgassing of the materials also need to be considered. In addition, when melting type materials are evaporated to form a relatively thick hole transport layer during mass production, thickness uniformity of the layer will be seriously affected. Thus, it is necessary to develop melting type materials used in the hole transport layer.

SUMMARY

An aim of the present disclosure is to provide a hole transport material, a manufacturing method thereof, and a display device to solve a following problem: in conventional technologies, when display devices are manufactured, evaporated materials of a hole transport layer are not stable, which is not beneficial for mass production.

To achieve the above goal, the present disclosure provides a hole transport material, comprising a molecule, wherein a main chain of the molecule comprises a spiro anthracene fluorene structure, and the molecule is represented by a following structural formula:

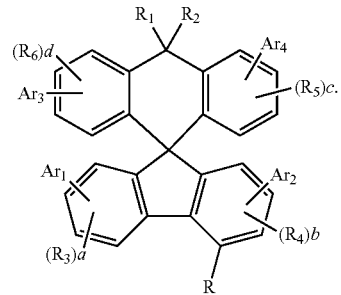

Wherein $Ar_1$, $Ar_2$, $Ar_3$, and $Ar_4$ comprise at least one of an aryl group or a heteroaryl group; R is at least one of a $C_1$-$C_{60}$ alkyl group, a $C_1$-$C_{60}$ aryl group, or a $C_1$-$C_{60}$ heteroaryl group; $R_1$-$R_6$ are respectively at least one of hydrogen, deuterium, a $C_1$-$C_{60}$ aryl group, or a $C_1$-$C_{60}$ heteroaryl group; and a, b, c, and d are an integer less than 5.

Furthermore, $Ar_1$, $Ar_2$, $Ar_3$, and $Ar_4$ are represented by one of following molecular structures:

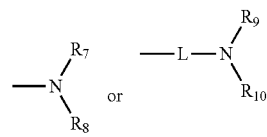

Wherein, $R_7$ to $R_{10}$ and L are a $C_1$-$C_{60}$ aryl group or a $C_{1-60}$ heteroaryl group.

Furthermore, L is represented by one of following group structures:

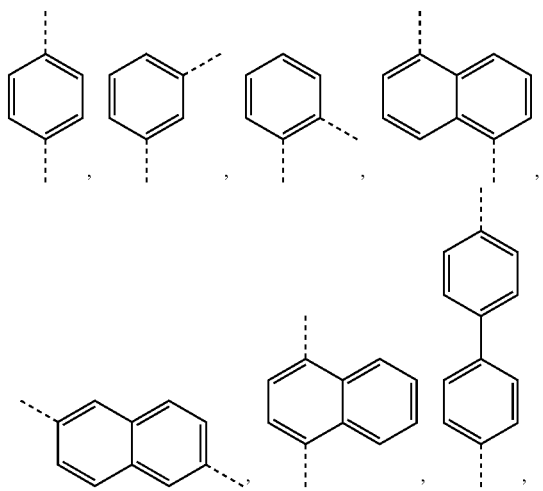

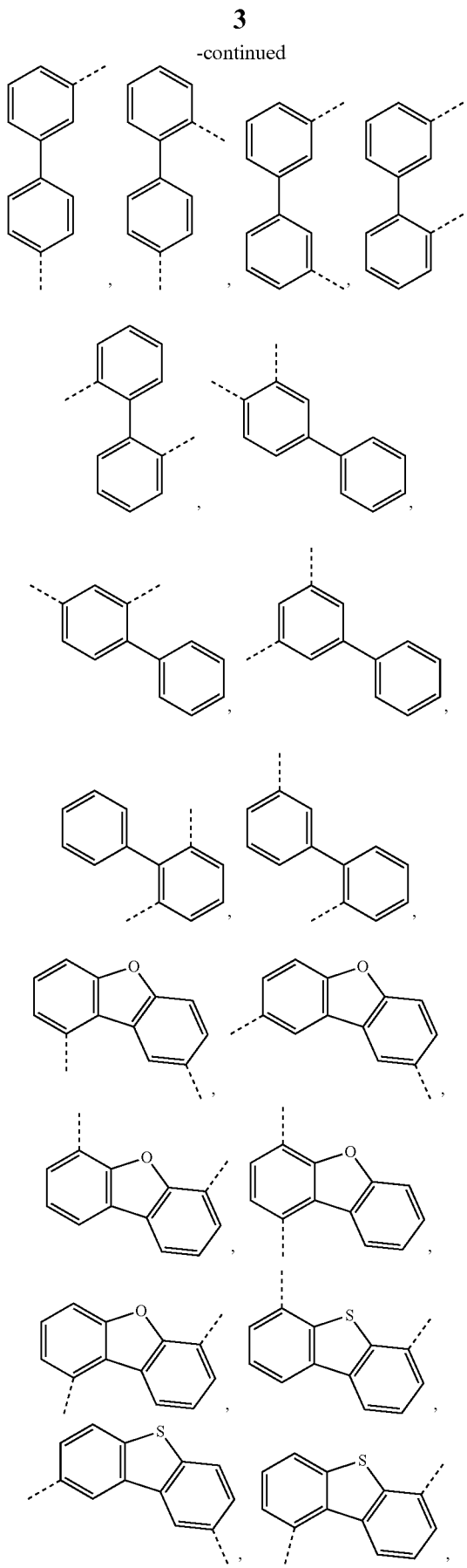

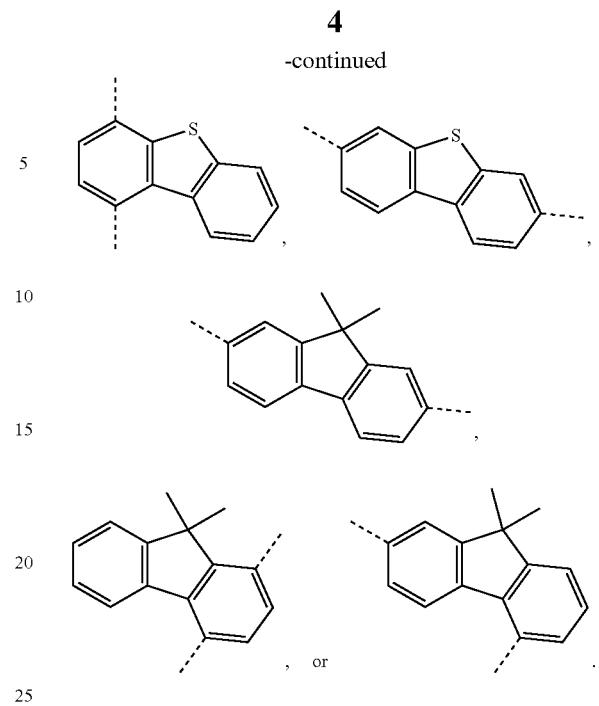

Furthermore, when a, b, c, and d are 0, R3 to R6 are respectively one of hydrogen or deuterium; and when a, b, c, and d are 1 to 4, R3 to R6 are respectively one of a $C_1$-$C_{60}$ alkyl group, a $C_1$-$C_{60}$ aryl group, or a $C_1$-$C_{60}$ heteroaryl group.

Furthermore, when a, b, c, and d are 0, the hole transport material is represented by a following structural formula:

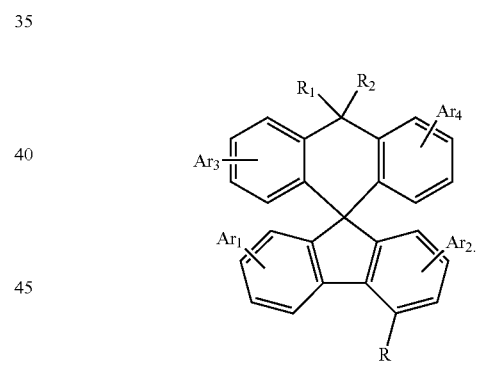

Furthermore, R is represented by one of following group structures:

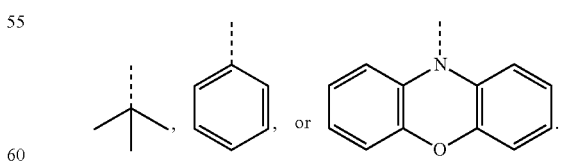

The present disclosure further provides a method of manufacturing a hole transport material, comprising following steps:

manufacturing a first compound, wherein the first compound comprises a following molecular structure:

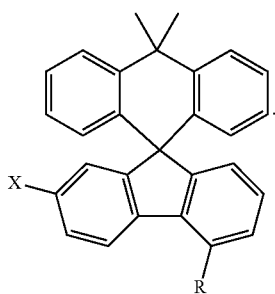

Wherein, R is at least one of a $C_1$-$C_{60}$ alkyl group, a $C_1$-$C_{60}$ aryl group, or a $C_1$-$C_{60}$ heteroaryl group, and X is one of halogen elements;

synthesizing a first target compound: performing a deoxidation process on the first compound and a second compound in a reaction vessel, adding a catalyst into the reaction vessel, and completely reacting the first compound with the second compound at a temperature ranging from 50° C. to 150° C. to obtain a first solution, wherein the second compound comprises at least one of an aryl group or a heteroaryl group; and performing a purification process on the first target compound: purifying the first solution by a silica gel column chromatography method with an eluent to obtain the hole transport material.

Furthermore, the step of manufacturing the first compound further comprises following steps:

manufacturing a third compound, wherein the third compound comprises a following molecular structure:

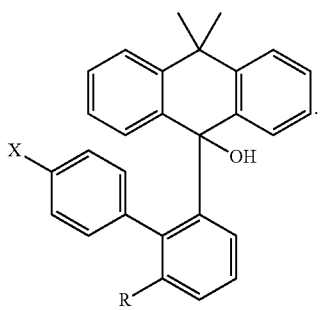

synthesizing a second target compound: completely reacting the third compound with a concentrated hydrochloric acid and a glacial acetic acid in a reaction vessel at a temperature ranging from 50° C. to 100° C., and adding sodium bicarbonate into the reaction vessel to obtain a second solution, wherein the second solution comprises the second target compound;

extracting the second target compound: adding dichloromethane into the second solution to extract the second target compound; and performing a purification process on the second target compound: purifying the second target solution by a silica gel column chromatography method with an eluent to obtain the second compound.

Furthermore, the step of manufacturing the third compound comprises a following step:

dissolving a fourth compound into tetrahydrofuran, adding butyl lithium into the tetrahydrofuran to obtain a reaction solution after a reaction, dripping tetrahydrofuran dissolved with a fifth compound into the reaction solution to obtain a third solution after a complete reaction, and removing liquid from the third solution to obtain a third compound.

Wherein, the fourth compound comprises a following molecular structure:

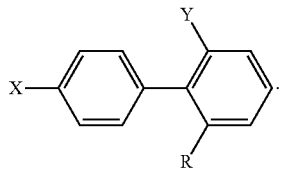

Y is a halogen element. The fifth compound comprises an anthracene structure.

The present disclosure further provides an electroluminescent device, comprising: a substrate layer, a first electrode disposed on the substrate layer; a hole injection layer disposed on the first electrode; a hole transport layer disposed on the hole injection layer, a luminescent layer disposed on the hole transport layer, an electron transport layer disposed on the luminescent layer, an electron injection layer disposed on the electron transport layer, and a second electrode disposed on the electron injection layer.

Wherein, the hole injection layer and/or the hole transport layer comprises the above-mentioned hole transport material.

Regarding the beneficial effects: the present disclosure provides a hole transport material. A molecular structure of the hole transport material includes aromatic amine that can effectively improve performance of hole injection and hole transport, thereby balancing electrons and holes in electroluminescent devices and realizing relatively low voltage and relatively high efficiency. An alkyl group, an aryl group, or a heteroaryl group is introduced at a 4-position of fluorene. Therefore, evaporation temperature, melting properties, sublimation properties, or mobility of the material may be adjusted, which is beneficial for stability of evaporation during mass production. Also, performance of devices is improved.

DESCRIPTION OF DRAWINGS

The FIGURE is a structural schematic view showing layers of an electroluminescent device according to an embodiment of the present disclosure.

In the drawing, reference numbers of components are as follows: substrate layer 1; first electrode 2; hole injection layer 3; hole transport layer 4; electron blocking layer 5; luminescent layer 6; electron transport layer 7; electron injection layer 8; second electrode 9.

DETAILED DESCRIPTION OF EMBODIMENTS

Preferred embodiments of the present disclosure are illustrated below with reference to accompanying drawings to prove that the present disclosure can be implemented. The embodiments are used to fully describe technical solutions of the present disclosure so that those skilled in the art may clearly and easily understand the technical solutions. The present disclosure may be realized by many different types of embodiments; therefore, the scope of protection of the present disclosure is not limited to the embodiments mentioned in the specification.

First Embodiment

The present embodiment provides a hole transport material, comprising a molecule, wherein a main chain of the molecule comprises a spiro anthracene fluorene structure, and the molecule is represented by a following structural formula:

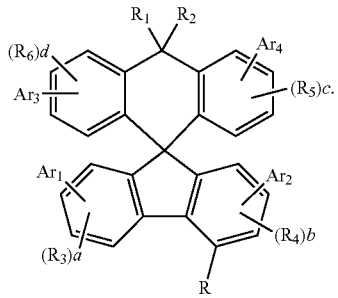

Wherein, $Ar_1$, $Ar_2$, $Ar_3$, and $Ar_4$ comprise at least one of an aryl group or a heteroaryl group; R is at least one of a $C_1$-$C_{60}$ alkyl group, a $C_1$-$C_{60}$ aryl group, or a $C_1$-$C_{60}$ heteroaryl group; $R_1$-$R_6$ are respectively at least one of hydrogen, deuterium, a $C_1$-$C_{60}$ aryl group, or a $C_1$-$C_{60}$ heteroaryl group; and a, b, c, and d are an integer less than 5.

Specifically, in the present embodiment, $Ar_1$ is represented by a following structural formula:

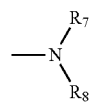

R7 and R8 are an aryl group or a heteroaryl group.
R is represented by a following structural formula:

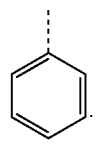

A-d are 0, and $R_1$-$R_6$ are hydrogen bonds.
Specifically, the hole transport material is represented by a following structural formula:

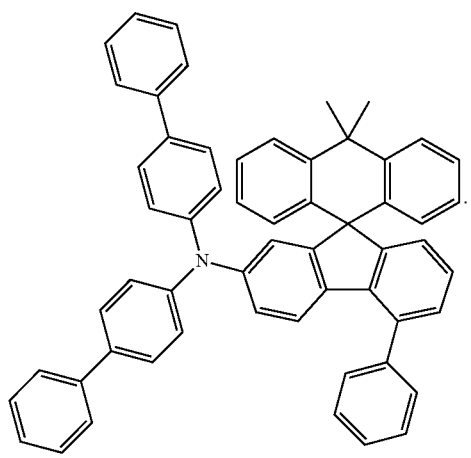 [SMILES: CC1(C)c2ccccc2C2(c3cc(N(c4ccc(-c5ccccc5)cc4)c4ccc(-c5ccccc5)cc4)ccc3-c3c(-c4ccccc4)cccc32)c2ccccc21]

The present embodiment further provides a method of manufacturing the above-mentioned hole transport material, including following steps:

Step S10, manufacturing a third compound, wherein the third compound comprises a following molecular structure:

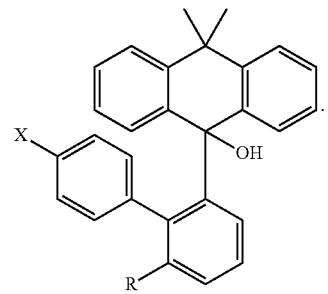

In this molecular structure, X is a halogen element, and R is at least one of a $C_1$-$C_{60}$ alkyl group, a $C_1$-$C_{60}$ aryl group, or a $C_1$-$C_{60}$ heteroaryl group.

Specifically, the step of manufacturing the third compound includes following steps:

adding a fourth compound (11 mmol, 3.43 g) and tetrahydrofuran (20 ml) into a reaction vessel, stirring and dissolving them in an argon environment, and slowly dripping butyl lithium (7.5 ml, 1.6M) into the reaction vessel at a temperature ranging from −60° C. to −90° C. (−78° C. is preferred) for 1 hour to obtain a reaction solution.

Wherein, the fourth compound includes a following molecular structure:

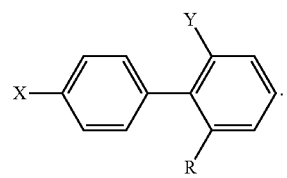

In this molecular structure, X and Y are a halogen element, and R is at least one of a $C_1$-$C_{60}$ alkyl group, a $C_1$-$C_{60}$ aryl group, or a $C_1$-$C_{60}$ heteroaryl group.

Dissolving a fifth compound (10 mmol, 2.22 g) into tetrahydrofuran (20 ml), slowly dripping them into the reaction solution at a temperature ranging from −60° C. to −90° C. (−78° C. is preferred). After that, raising the temperature of the reaction solution to a room temperature and allowing the reaction solution to react for 12 hours. Then, adding an appropriate amount of ammonium chloride to perform a quenching reaction to obtain the third solution. Finally, removing liquid from the third solution by rotation to obtain the third compound. Wherein, the fifth compound comprises an anthracene structure.

Specifically, the fourth compound is 1-Bromo-3′-chloro-4-phenylbiphenyl, the fifth compound is 9,9-Dimethylanthrone. Synthesis of the third compound is represented by Formula 1:

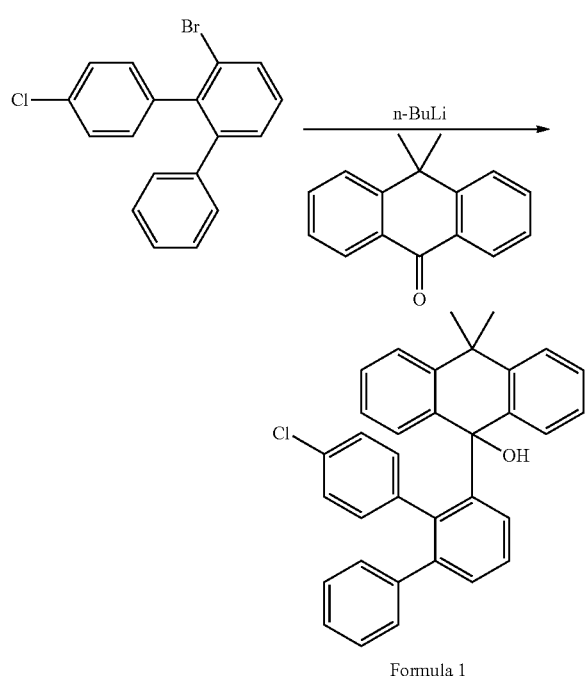

Formula 1

Step S20, manufacturing a first compound, wherein the first compound includes a following molecular structure:

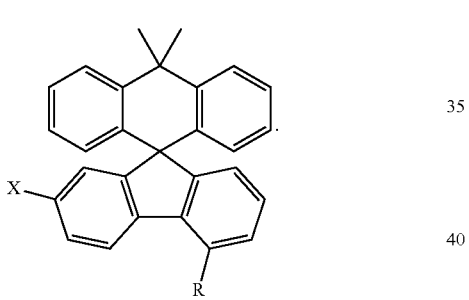

In this molecular structure, X is a halogen element, and R is at least one of a $C_1$-$C_{60}$ alkyl group, a $C_1$-$C_{60}$ aryl group, or a $C_1$-$C_{60}$ heteroaryl group.

Specifically, the step of manufacturing the first compound includes following steps:

Step S21, synthesizing a second target compound: putting the third compound obtained from the step S10 into a reaction vessel, adding concentrated hydrochloric acid (5 ml) and glacial acetic acid (15 ml) into the reaction vessel, and allowing them to react at a temperature ranging from 50° C. to 100° C. (80° C. is preferred) for 24 hours to obtain a second solution. Wherein, the second solution includes the second target compound.

Step S22, extracting the second target compound: after the second solution is cooled to room temperature, pouring it into ice water. Then, adding sodium bicarbonate aqueous solution (1M) into the ice water, thereby neutralizing acid solution of the second solution. After that, repeatedly performing extraction process with dichloromethane three times, and washing with water extracts obtained from the extraction process three times. Finally, drying the extracts with anhydrous sodium sulfate, and filtrating and concentrating the dried extracts to obtain the second target compound.

Step S23, purifying the second compound: using petroleum ether and methylene chloride (a volume ratio is 4:1) as an eluent cooperated with a silica gel chromatography column of 200-300 mesh to separate and purify organic substances, thereby obtaining the first compound (4.31 g) with 92% yield rate.

Specifically, synthesis of the first compound is represented by Formula 2:

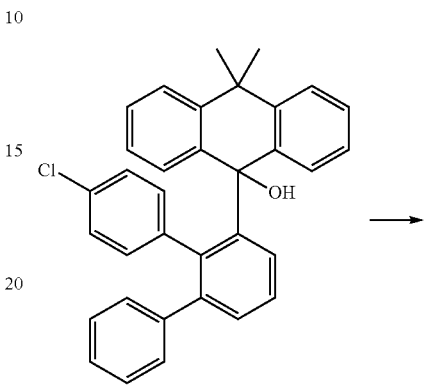

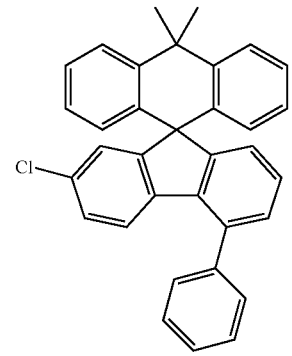

Formula 2

Step S30, synthesizing a first target compound: putting the first compound (2.35 g, 5 mmol), the second compound (1.61 g, 5 mmol), t-BuONa (8 mmol, 0.76 g), and toluene (30 ml) into a reaction vessel, deoxidating with nitrogen. Then, adding tris(dibenzylideneacetone)dipalladium (0.09 mmol, 81 mg) and tri-tert-butyl phosphine tetrafluoroborate (0.92 mmol, 0.24 g) into the reaction vessel, and allowing them to fully react at a temperature ranging from 100° C. to 150° C. (110° C. is preferred) to obtain the first solution. The first solution includes the first target compound, and the second compound includes at least one of an aryl group or a heteroaryl group.

Step S40, purifying the first target compound: after the first solution is cooled to room temperature, concentrating the first solution to obtain the first target compound. Then, using a silica gel chromatography column of 200-300 mesh to separate and purify organic substances, thereby obtaining the hole transport material (3.21 g) with 85% yield rate.

Specifically, the second compound is di-4-phenyl-aniline. Synthesis of the hole transport material is represented by Formula 3:

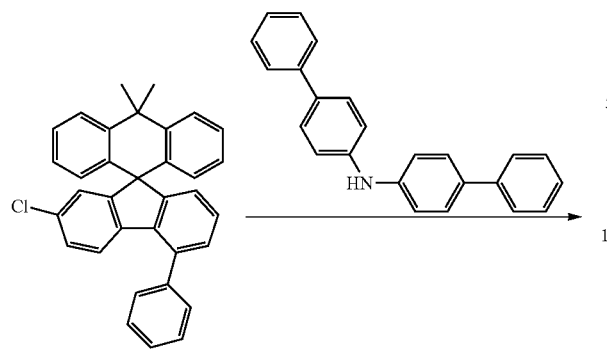

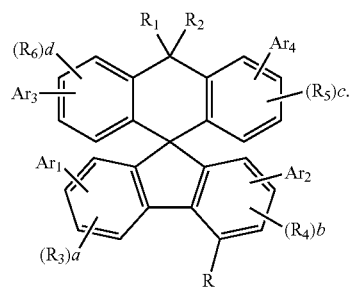

Wherein $Ar_1$, $Ar_2$, $Ar_3$, and $Ar_4$ comprise at least one of an aryl group or a heteroaryl group; R is at least one of a $C_1$-$C_{60}$ alkyl group, a $C_1$-$C_{60}$ aryl group, or a $C_1$-$C_{60}$ heteroaryl group; $R_1$-$R_6$ are respectively at least one of hydrogen, deuterium, a $C_1$-$C_{60}$ aryl group, or a $C_1$-$C_{60}$ heteroaryl group; and a, b, c, and d are an integer less than 5.

Specifically, in the present embodiment, $Ar_1$ is represented by a following structural formula:

R7 and R8 are an aryl group or a heteroaryl group.

R is represented by a following structural formula:

a-d are 0, and R—$R_6$ are hydrogen bonds.

Specifically, the hole transport material is represented by a following structural formula:

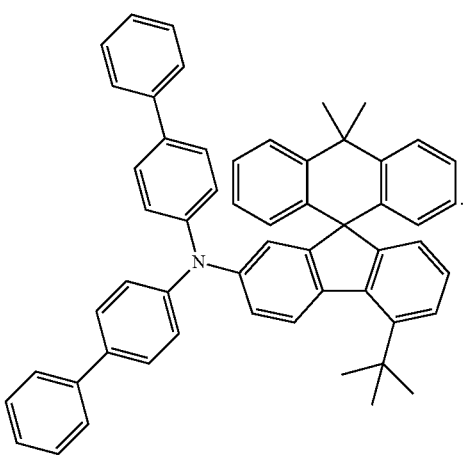

The present embodiment provides a hole transport material. A molecular structure of the hole transport material includes aromatic amine that can effectively improve performance of hole injection and hole transport, thereby balancing electrons and holes in electroluminescent devices and realizing relatively low voltage and relatively high efficiency. An alkyl group, an aryl group, or a heteroaryl group is introduced at a 4-position of fluorene. Therefore, evaporation temperature, melting properties, sublimation properties, or mobility of the material may be adjusted, which is beneficial for stability of evaporation during mass production. Also, performance of devices is improved.

Second Embodiment

The present embodiment provides a hole transport material, comprising a molecule, wherein a main chain of the molecule comprises a spiro anthracene fluorene structure, and the molecule is represented by a following structural formula:

Formula 3

The present embodiment further provides a method of manufacturing the above-mentioned hole transport material, including following steps:

Step S10, manufacturing a third compound, wherein the third compound comprises a following molecular structure:

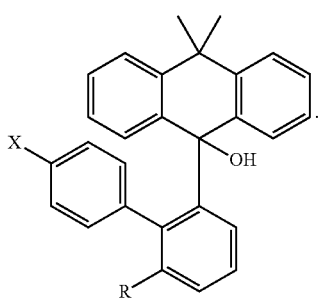

In this molecular structure, X is a halogen element, and R is at least one of a $C_1$-$C_{60}$ alkyl group, a $C_1$-$C_{60}$ aryl group, or a $C_1$-$C_{60}$ heteroaryl group.

Specifically, the step of manufacturing the third compound includes following steps:

adding a fourth compound (11 mmol, 3.55 g) and tetrahydrofuran (20 ml) into a reaction vessel, stirring and dissolving them in an argon environment, and slowly dripping butyl lithium (7.5 ml, 1.6M) into the reaction vessel at a temperature ranging from −60° C. to −90° C. (−78° C. is preferred) for 1 hour to obtain a reaction solution. Wherein, the fourth compound includes a following molecular structure:

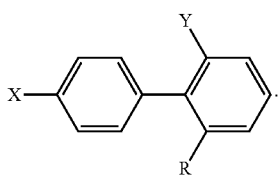

In this molecular structure, X and Y are a halogen element, and R is at least one of a $C_1$-$C_{60}$ alkyl group, a $C_1$-$C_{60}$ aryl group, or a $C_1$-$C_{60}$ heteroaryl group.

Dissolving a fifth compound (10 mmol, 2.22 g) into tetrahydrofuran (20 ml), slowly dripping them into the reaction solution at a temperature ranging from −60° C. to −90° C. (−78° C. is preferred). After that, raising the temperature of the reaction solution to a room temperature and allowing the reaction solution to react for 12 hours. Then, adding an appropriate amount of ammonium chloride to perform a quenching reaction to obtain the third solution. Finally, removing liquid from the third solution through rotation to obtain the third compound. Wherein the fifth compound comprises an anthracene structure.

Specifically, the fourth compound is 1-Bromo-3′-chloro-4-phenylbiphenyl, and the fifth compound is 9,9-Dimethylanthrone. Synthesis of the third compound is represented by Formula 4:

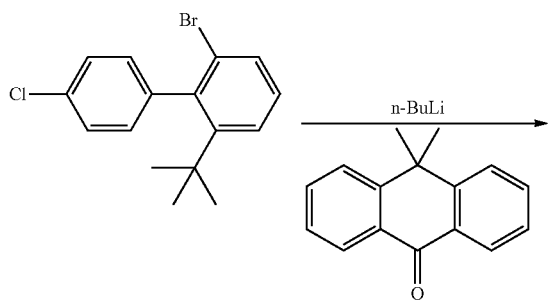

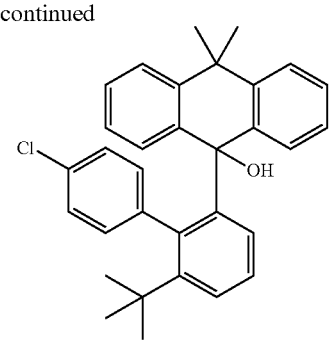

Formula 4

Step S20, manufacturing a first compound, wherein the first compound includes a following molecular structure:

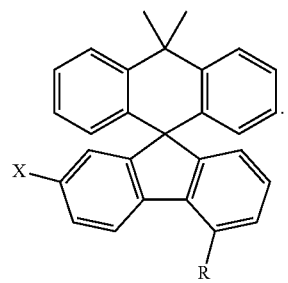

In this molecular structure, X is a halogen element, and R is at least one of a $C_1$-$C_{60}$ alkyl group, a $C_1$-$C_{60}$ aryl group, or a $C_1$-$C_{60}$ heteroaryl group.

Specifically, the step of manufacturing the first compound includes following steps:

Step S21, synthesizing a second target compound: putting the third compound obtained from the step S10 into a reaction vessel, adding concentrated hydrochloric acid (5 ml) and glacial acetic acid (15 ml) into the reaction vessel, and allowing them to react at a temperature ranging from 50° C. to 100° C. (80° C. is preferred) for 24 hours to obtain a second solution. Wherein, the second solution includes the second target compound.

Step S22, extracting the second target compound: after the second solution is cooled to room temperature, pouring it into ice water. Then, adding sodium bicarbonate aqueous solution (1M) into the ice water, thereby neutralizing acid solution of the second solution. After that, repeatedly performing extraction process with dichloromethane three times, and washing with water extracts obtained from the extraction process three times. Finally, drying the extracts with anhydrous sodium sulfate, and filtrating and concentrating the dried extracts to obtain the second target compound.

Step S23, purifying the second compound: using petroleum ether and methylene chloride (a volume ratio is 5:1) as an eluent cooperated with a silica gel chromatography column (200-300 mesh) to separate and purify organic substances, thereby obtaining the first compound (3.95 g) with 88% yield rate.

Specifically, synthesis of the first compound is represented by Formula 5:

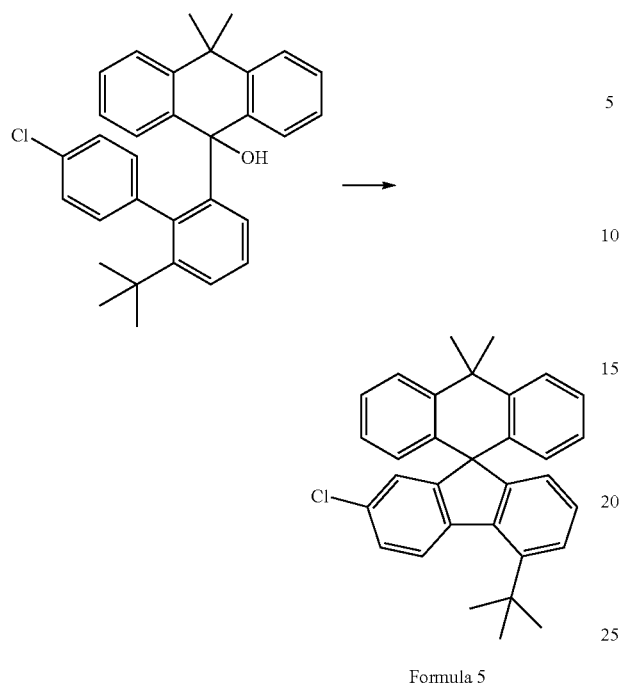

Formula 5

Step S30, synthesizing a first target compound: putting the first compound (2.25 g, 5 mmol), the second compound (1.61 g, 5 mmol), t-BuONa (8 mmol, 0.76 g), and toluene (30 ml) into a reaction vessel, deoxidating with nitrogen. Then, adding tris(dibenzylideneacetone)dipalladium (0.09 mmol, 81 mg) and tri-tert-butyl phosphine tetrafluoroborate (0.92 mmol, 0.24 g) into the reaction vessel, and allowing them to fully react at a temperature ranging from 100° C. to 150° C. (110° C. is preferred) to obtain the first solution. The first solution includes the first target compound, and the second compound includes at least one of an aryl group or a heteroaryl group.

Step S40, purifying the first target compound: after the first solution is cooled to room temperature, concentrating the first solution to obtain the first target compound. Then, using a silica gel chromatography column (200-300 mesh) to separate and purify organic substances, thereby obtaining the hole transport material (3.16 g) with 86% yield rate.

Specifically, the second compound is di-4-phenyl-aniline. Synthesis of the hole transport material is represented by Formula 6:

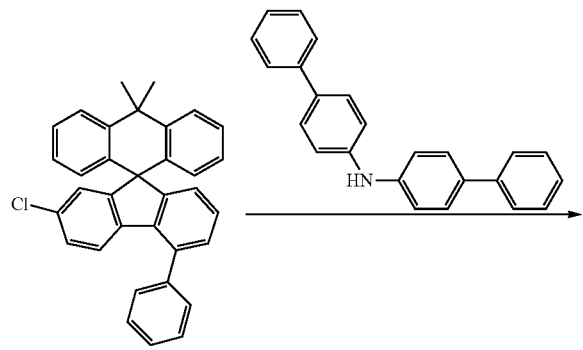

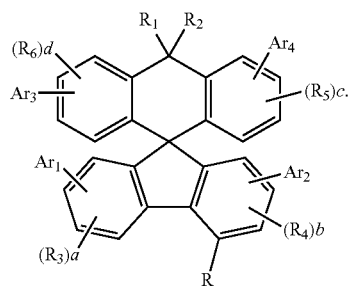

Formula 6

The present embodiment provides a hole transport material. A molecular structure of the hole transport material includes aromatic amine that can effectively improve performance of hole injection and hole transport, thereby balancing electrons and holes in electroluminescent devices and realizing relatively low voltage and relatively high efficiency. An alkyl group, an aryl group, or a heteroaryl group is introduced at a 4-position of fluorene. Therefore, evaporation temperature, melting properties, sublimation properties, or mobility of the material may be adjusted, which is beneficial for stability of evaporation during mass production. Also, performance of devices is also improved.

Third Embodiment

The present embodiment provides a hole transport material, comprising a molecule, wherein a main chain of the molecule comprises a spiro anthracene fluorene structure, and the molecule is represented by a following structural formula:

Wherein, $Ar_1$, $Ar_2$, $Ar_3$, and $Ar_4$ comprise at least one of an aryl group or a heteroaryl group; R is at least one of a $C_1$-$C_{60}$ alkyl group, a $C_1$-$C_{60}$ aryl group, or a $C_1$-$C_{60}$ heteroaryl group; $R_1$ to $R_6$ are respectively at least one of hydrogen, deuterium, a $C_1$-$C_{60}$ aryl group, or a $C_1$-$C_{60}$ heteroaryl group; and a, b, c, and d are an integer less than 5.

Specifically, in the present embodiment, $Ar_1$ is represented by a following structural formula:

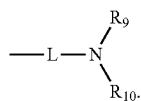

$R_9$ and $R_{10}$ are an aryl group or a heteroaryl group, and L is represented by a following structural formula:

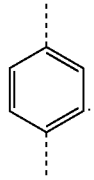

R is represented by a following structural formula:

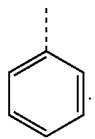

a-d are 0, and $R_1$-$R_6$ are hydrogen bonds.

Specifically, the hole transport material is represented by a following structural formula:

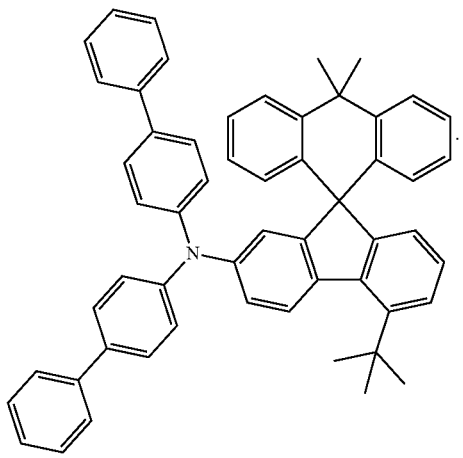 [SMILES: CC(C)(C)c1cccc2c1-c1ccc(N(c3ccc(-c4ccccc4)cc3)c3ccc(-c4ccccc4)cc3)cc1C21c2ccccc2C(C)(C)c2ccccc21]

The present embodiment further provides a method of manufacturing the above-mentioned hole transport material, including following steps:

Step S10, manufacturing a third compound, wherein the third compound comprises a following molecular structure:

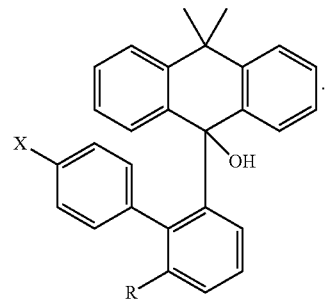

In this molecular structure, X is a halogen element, and R is at least one of a $C_1$-$C_{60}$ alkyl group, a $C_1$-$C_{60}$ aryl group, or a $C_1$-$C_{60}$ heteroaryl group.

Specifically, the step of manufacturing the third compound includes following steps:

adding a fourth compound (11 mmol, 3.43 g) and tetrahydrofuran (20 ml) into a reaction vessel, stirring and dissolving them in an argon environment, and slowly dripping butyl lithium (7.5 ml, 1.6M) into the reaction vessel at a temperature ranging from −60° C. to −90° C. (−78° C. is preferred) for 1 hour to obtain a reaction solution.

Wherein, the fourth compound includes a following molecular structure:

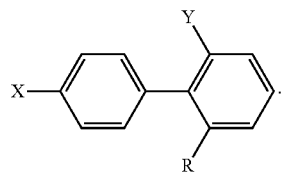

In this molecular structure, X and Y are a halogen element, and R is at least one of a $C_1$-$C_{60}$ alkyl group, a $C_1$-$C_{60}$ aryl group, or a $C_1$-$C_{60}$ heteroaryl group.

Dissolving a fifth compound (10 mmol, 2.22 g) into tetrahydrofuran (20 ml), slowly dripping them into the reaction solution at a temperature ranging from −60° C. to −90° C. (−78° C. is preferred). After that, raising the temperature of the reaction solution to a room temperature and allowing the reaction solution to react for 12 hours. Then, adding an appropriate amount of ammonium chloride to perform a quenching reaction to obtain the third solution. Finally, removing liquid from the third solution by rotation to obtain the third compound. Wherein, the fifth compound comprises an anthracene structure.

Specifically, the fourth compound is 1-Bromo-3'-chloro-4-phenylbiphenyl, the fifth compound is 9,9-Dimethylanthrone. Synthesis of the third compound is represented by Formula 7:

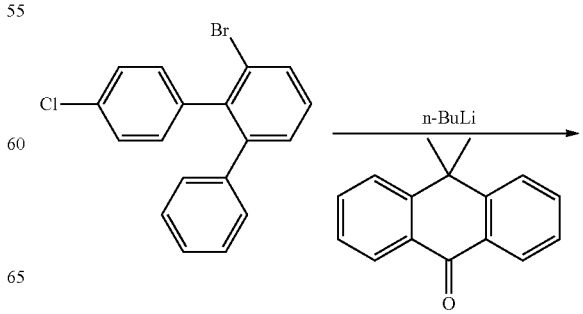

-continued

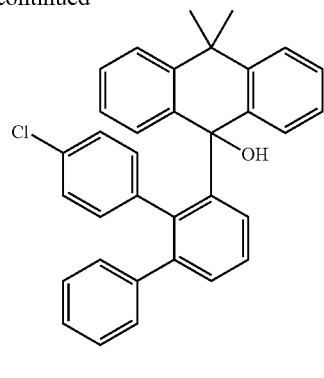

Formula 7

Step S20, manufacturing a first compound, wherein the first compound includes a following molecular structure:

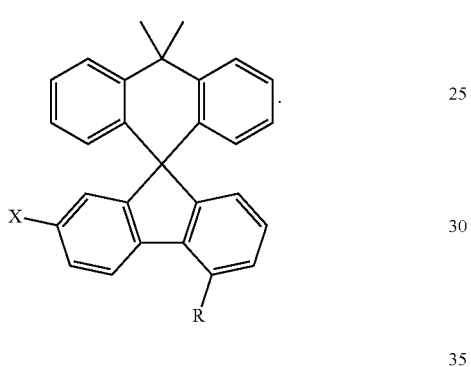

In this molecular structure, X is a halogen element, and R is at least one of a $C_1$-$C_{60}$ alkyl group, a $C_1$-$C_{60}$ aryl group, or a $C_1$-$C_{60}$ heteroaryl group.

Specifically, the step of manufacturing the first compound includes following steps:

Step S21, synthesizing a second target compound: putting the third compound obtained from the step S10 into a reaction vessel, adding concentrated hydrochloric acid (5 ml) and glacial acetic acid (15 ml) into the reaction vessel, and allowing them to react at a temperature ranging from 50° C. to 100° C. (80° C. is preferred) for 24 hours to obtain a second solution. Wherein the second solution includes the second target compound.

Step S22, extracting the second target compound: after the second solution is cooled to room temperature, pouring it into ice water. Then, adding sodium bicarbonate aqueous solution (1M) into the ice water, thereby neutralizing acid solution of the second solution. After that, repeatedly performing extraction process with dichloromethane three times, and washing with watch extracts obtained from the extraction process three times. Finally, drying the extracts with anhydrous sodium sulfate, and filtrating and concentrating the dried extracts to obtain the second target compound.

Step S23, purifying the second compound: using petroleum ether and methylene chloride (a volume ratio is 4:1) as an eluent cooperated with a silica gel chromatography column (200-300 mesh) to separate and purify organic substances, thereby obtaining the first compound (4.31 g) with 92% yield rate.

Specifically, synthesis of the first compound is represented by Formula 8:

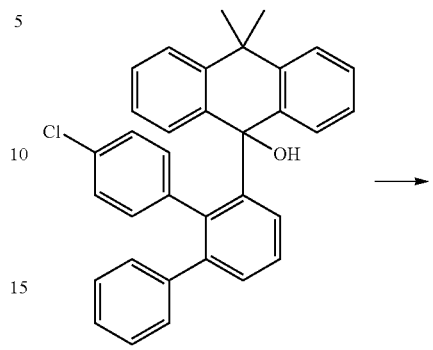

Formula 8

Step S30, synthesizing a first target compound: putting the first compound (2.35 g, 5 mmol), the second compound (2.88 g, 5.5 mmol), tetrahydrofuran (10 ml), and sodium carbonate aqueous solution (5 ml, 1.6M) into a reaction vessel, deoxidating with nitrogen. Then, adding tetra(triphenylphosphonium) palladium (0.24 g, 0.2 mmol) into the reaction vessel, and allowing them to fully react at a temperature ranging from 50° C. to 100° C. (80° C. is preferred) to obtain the first solution. The first solution includes the first target compound, and the second compound includes at least one of an aryl group or a heteroaryl group.

Step 40, extracting the first target compound: after the first solution is cooled to room temperature, repeatedly performing extraction process with dichloromethane three times, and washing extracts obtained from the extraction process three times. Then, drying the extracts with anhydrous sodium sulfate, and filtrating and spin-drying the dried extracts to obtain the first target compound.

Step S50, purifying the first target compound: using petroleum ether and methylene chloride (a volume ratio is 5:1) as an eluent cooperated with a silica gel chromatography column (200-300 mesh) to separate and purify organic substances, thereby obtaining the hole transport material (3.78 g) with 91% yield rate.

Specifically, the second compound is di-4-phenyl-aniline. Synthesis of the hole transport material is represented by Formula 9:

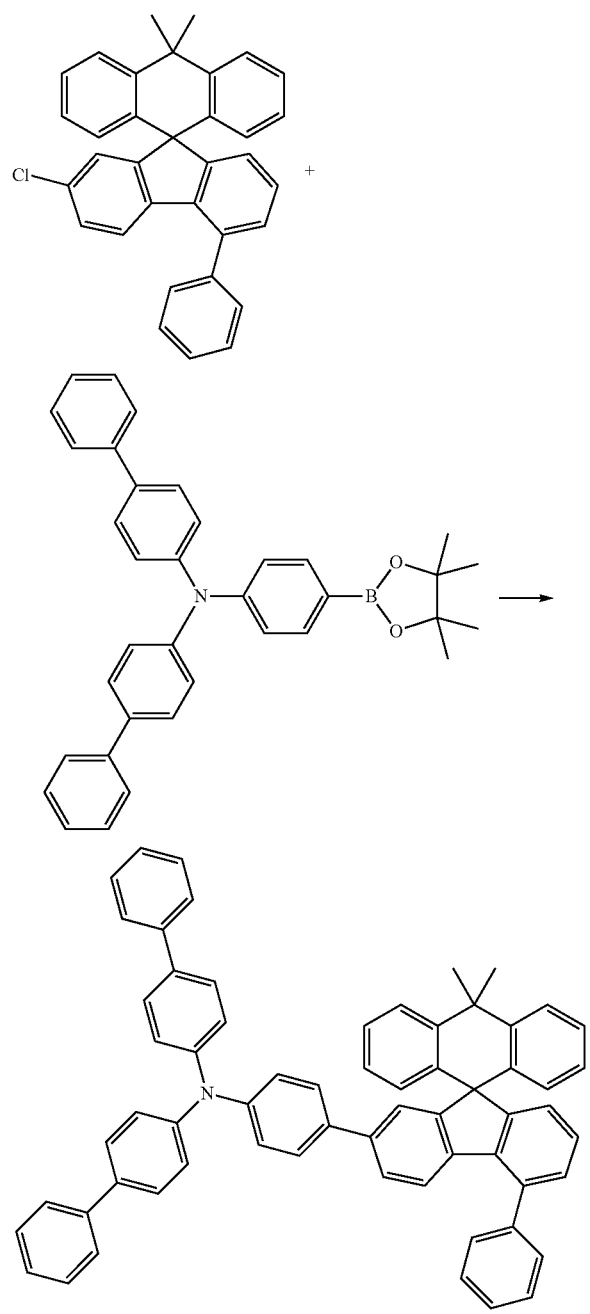
Formula 9
In the present embodiment, L of the molecular structure of the hole transport material is:
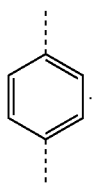
However, in other embodiments, L of the molecular structure of the hole transport material may further be one of following structures:
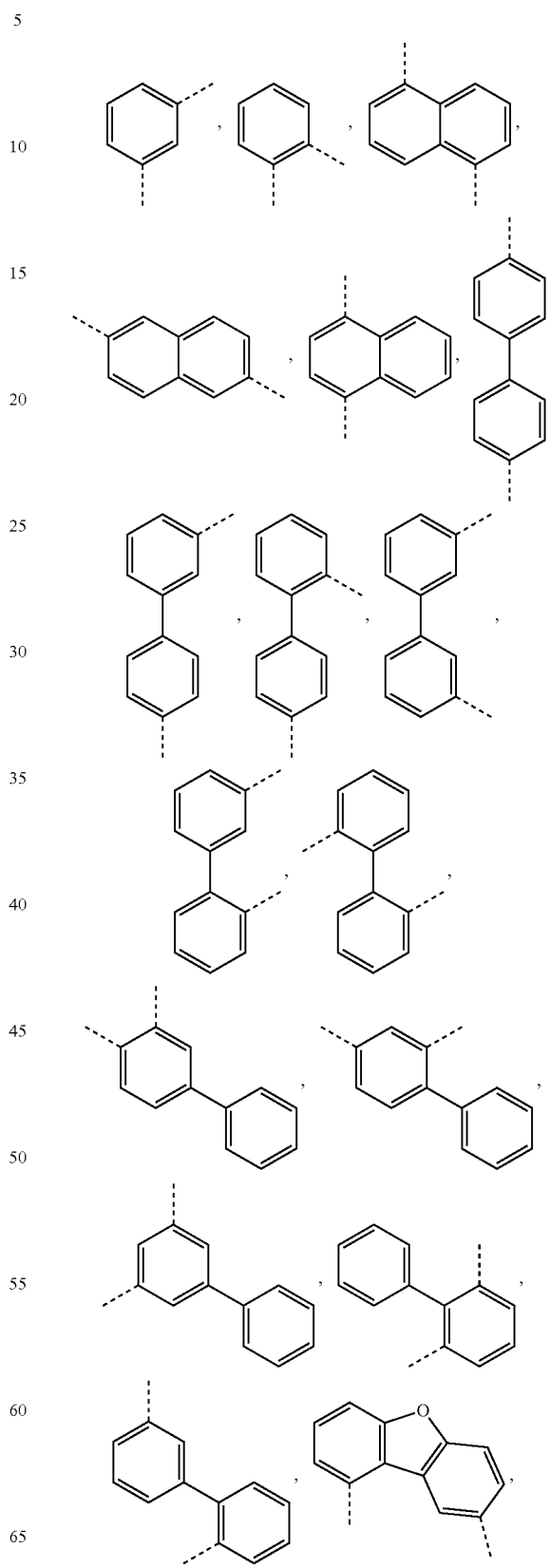

-continued

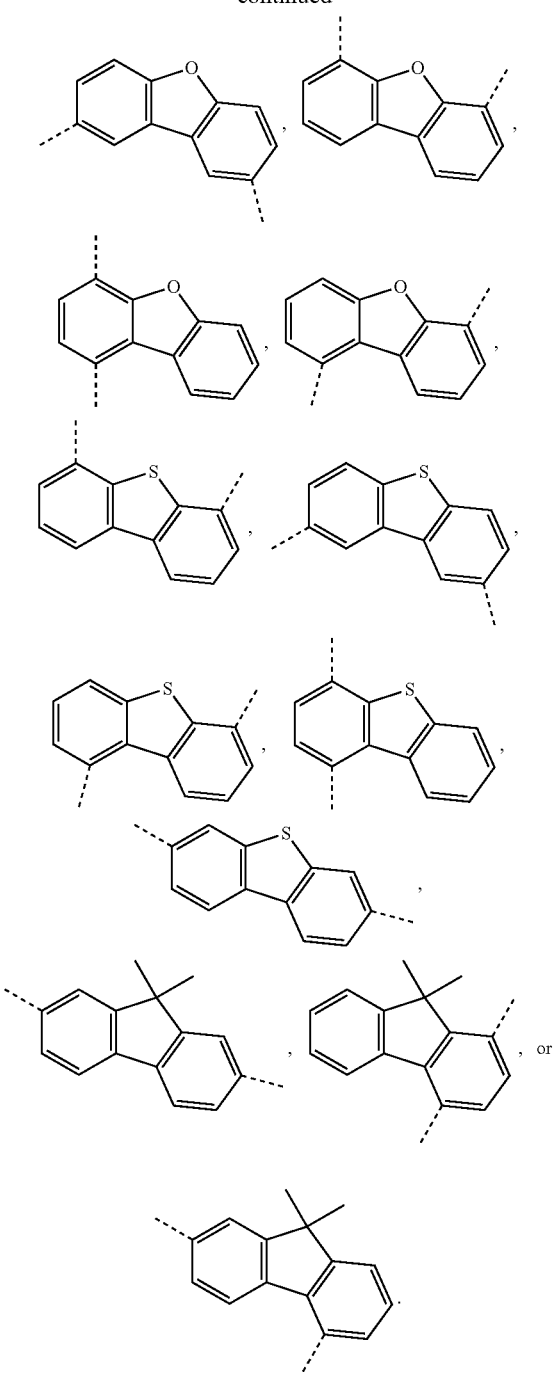

The present embodiment provides a hole transport material. A molecular structure of the hole transport material includes aromatic amine that can effectively improve performance of hole injection and hole transport, thereby balancing electrons and holes in electroluminescent devices and realizing relatively low voltage and relatively high efficiency. An alkyl group, an aryl group, or a heteroaryl group is introduced at a 4-position of fluorene. Therefore, evaporation temperature, melting properties, sublimation properties, or mobility of the material may be adjusted, which is beneficial for stability of evaporation during mass production. Also, performance of devices is improved.

Application Embodiment

In the present embodiment, the hole transport materials manufactured from the first embodiment, the second embodiment, and the third embodiment are applied to an electroluminescent device.

As shown in the FIGURE, the present embodiment provides an electroluminescent device, including a substrate layer 1, a first electrode 2, a hole injection layer 3, a hole transport layer 4, an electron blocking layer 5, a luminescent layer 6, an electron transport layer 7, an electrode injection layer 8, and a second electrode 9.

The substrate layer 1 is a glass substrate layer configured to protect an entire structure of the electroluminescent device. The first electrode 2 is disposed on the substrate layer 1. A material of the first electrode 2 is indium tin oxide (ITO). The first electrode 2 is configured to transport a voltage and provide holes. The hole injection layer 3 is disposed on a surface of the first electrode 2 away from the substrate 1. A material of the hole injection layer 3 is hexanitrilehexaazatriphenylene (HATCN), and a thickness of the hole injection layer 3 is 10 mm. The hole injection layer 3 is configured to inject holes therein into the luminescent layer 6. The hole transport layer 4 is disposed on a surface of the hole injection layer 3 away from the first electrode 2. A material of the hole transport layer 4 is the hole transport material, and a thickness of the hole transport layer 4 is 40 nm. The hole transport layer 4 is configured to transport holes in the hole injection layer 3 to the luminescent layer 6. The electron blocking layer 5 is disposed on a surface of the hole transport layer 4 away from the hole injection layer 3, and a material of the electron blocking layer 5 is 4,4',4"-Tris(carbazol-9-yl)triphenylamine (TCTA), and a thickness of the electron blocking layer 5 is 20 nm. The electron blocking layer 5 is configured to block electrons in the luminescent layer 6 from entering the hole transport layer 4. The luminescent layer 6 is disposed on a surface of the electron blocking layer 5 away from the hole transport layer 4. A material of the luminescent layer 6 is tris(2-phenylpyridine) iridium, and a thickness of the luminescent layer 6 is 30 nm. Driven by current and voltage, holes provided by the first electrode 2 and electrons provided by the second electrode 9 combine in the luminescent layer 6. Therefore, electric energy is converted into photon energy, thereby realizing electroluminescence. The electron transport layer 7 is disposed on a surface of the luminescent layer 6 away from the electron blocking layer 5. A material of the electron transport layer 7 is 1,3,5-Tris(3-(3-pyridyl)phenyl)benzene (TM3PyPB), and a thickness of the electron transport layer 7 is 10 nm. The electron transport layer 7 is configured to transport electrons in the electron injection layer 8 into the luminescent layer 6. The electron injection layer 8 is disposed on a surface of the electron transport layer 7 away from the luminescent layer 6. A material of the electron injection layer 8 is B-Phen, and a thickness of the electron injection layer 8 is 40 nm. The second electrode 9 is disposed on a surface of the electron injection layer 8 away from the electron transport layer 7. A material of the second electrode 9 is lithium fluoride and aluminum. The second electrode 9 is configured to transport voltage and provide electrons.

To clearly illustrate performance of the hole transport material provided by the present disclosure, performance of electroluminescent devices formed from the hole transport materials of the first embodiment, the second embodiment, and the third embodiment is tested. The performance of electroluminescent devices formed from the hole transport materials of the first embodiment, the second embodiment, and the third embodiment are respectively shown in Table. 1. The hole transport material of the first embodiment is applied to a device 1, the hole transport material of the second embodiment is applied to a device 2, and the hole transport material of the third embodiment is applied to a device 3. Specifically, the lowest occupied molecular orbital (LUMO), the highest occupied molecular orbital (HOMO), the lowest triplet energy level (T1), voltage, maximum current efficiency, and the highest external quantum efficiency (HEQE) are tested.

TABLE 1

| Device | LUMO (eV) | HOMO (eV) | T1 (eV) | voltage (V) | maximum current efficiency (cd/A) | HEQE (%) |
|---|---|---|---|---|---|---|
| Device 1 | 2.51 | −5.53 | 2.57 | 3.7 | 58.2 | 26.1 |
| Device 2 | 2.48 | −5.51 | 2.58 | 3.8 | 60.1 | 27.2 |
| Device 3 | 2.56 | −5.56 | 2.52 | 3.4 | 62.4 | 29.1 |

According to Table. 1, the hole transport material provided by the present disclosure has exceptional luminescent performance, and a hole transport layer formed of the hole transport material has better hole injection/transport performance. A relatively high EQE may be achieved with relatively low voltage, thereby realizing higher luminescent efficiency and better stability.

In other application embodiments of the present disclosure, the hole transport material may also be applied to a hole injection layer.

In the first embodiment, the second embodiment, and the third embodiment of the present disclosure, R of the molecular structure of the hole transport material is represented by one of following structural formulas:

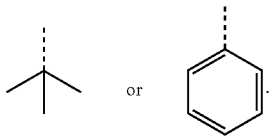

However, in other embodiments, R may also be represented by a following structural formula:

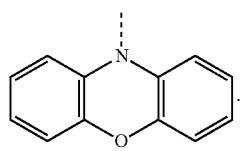

In other embodiments of the present disclosure, the molecular structure of the hole transport material may also be represented by one of following structural formulas:

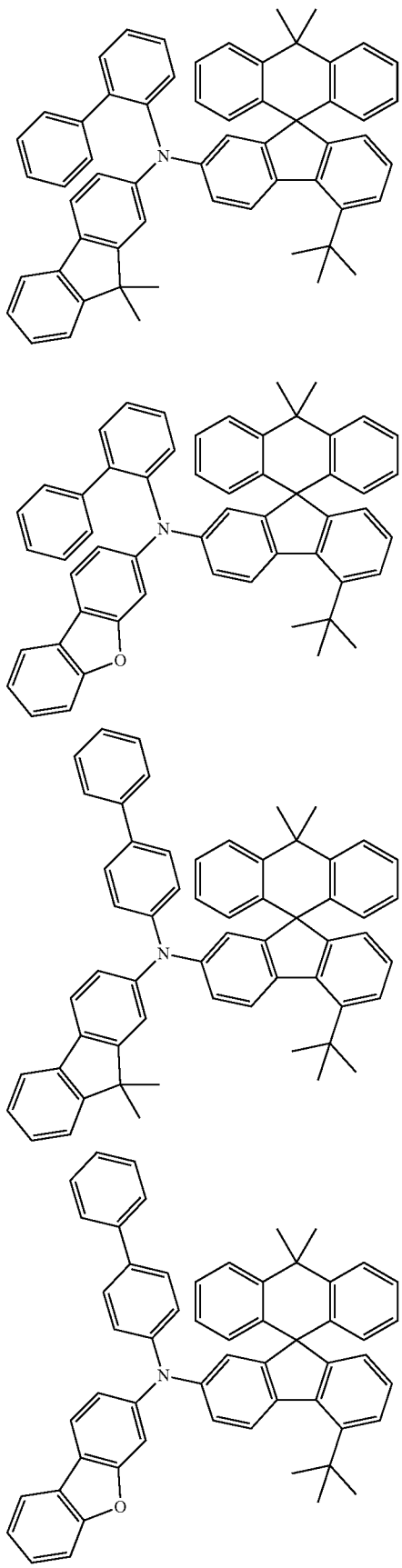

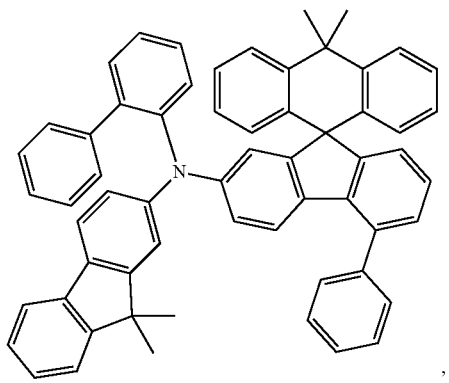
,
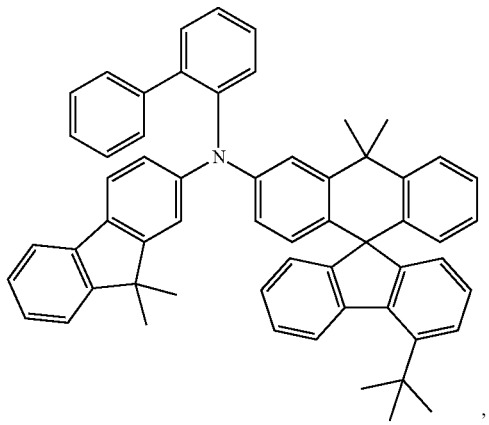
,
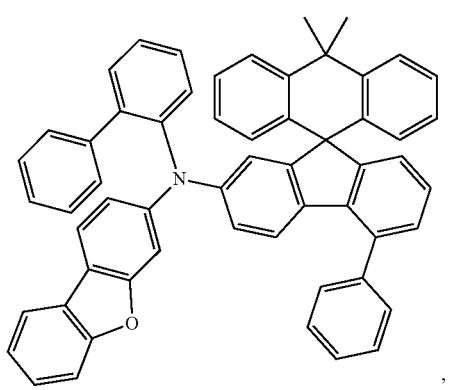
,
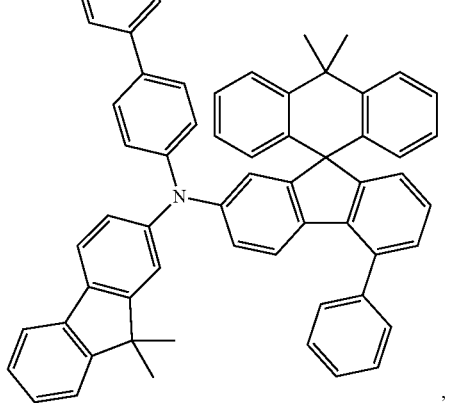
,
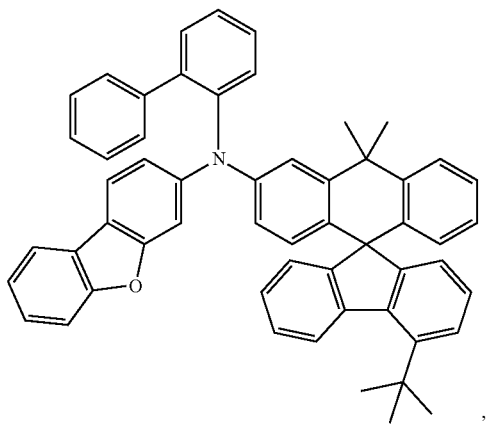
,
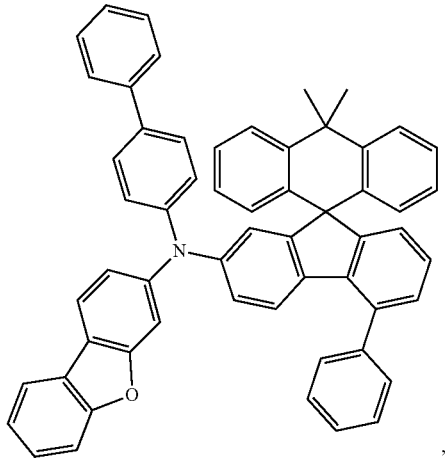
,
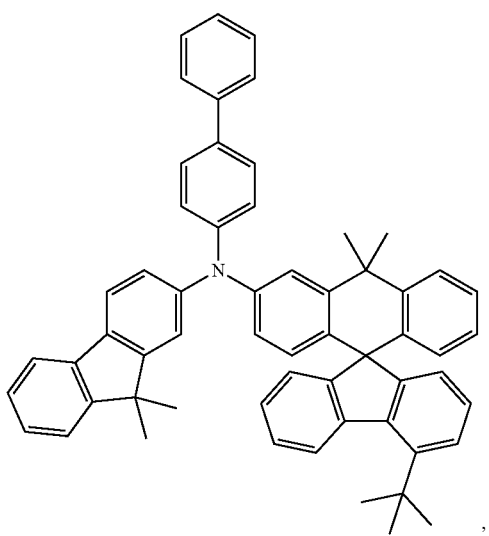
,

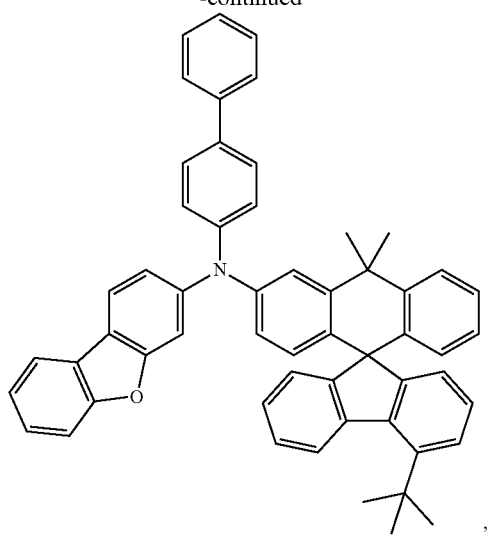
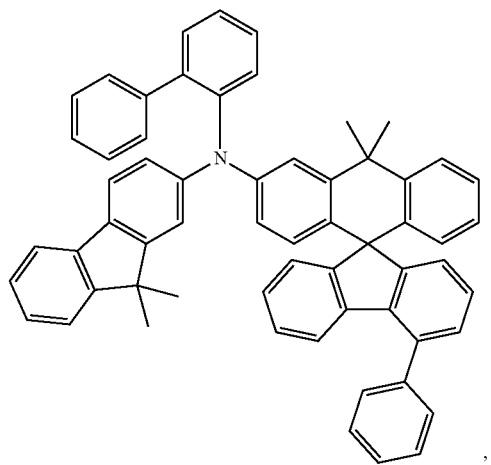
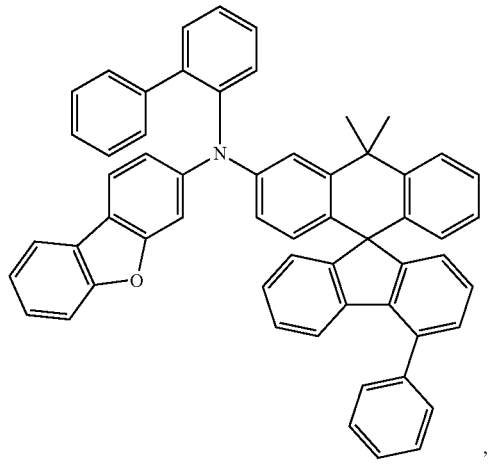
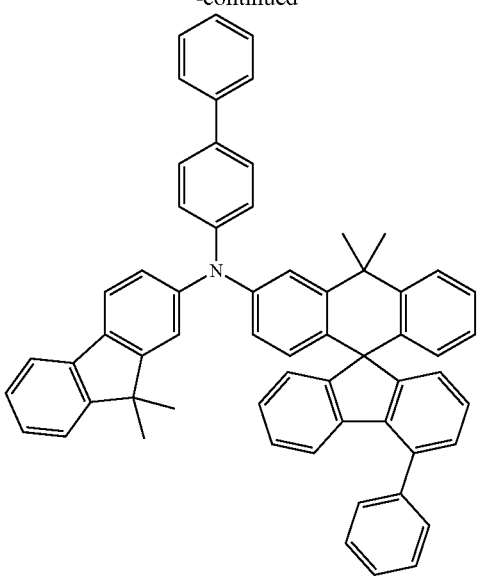
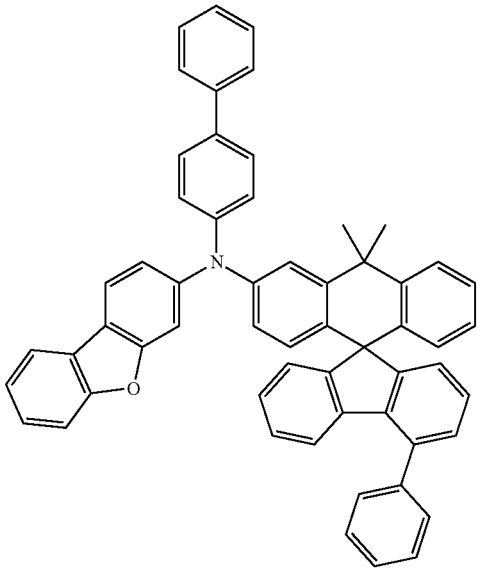
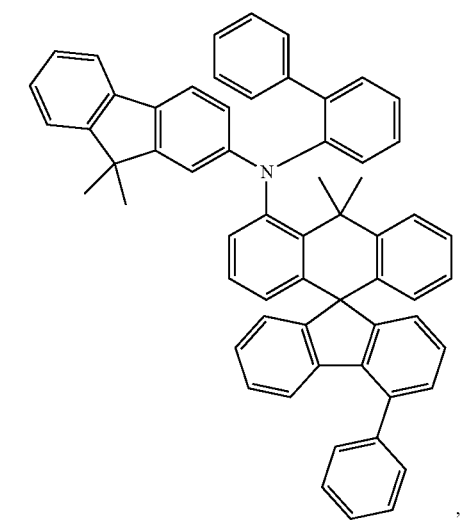

31
-continued
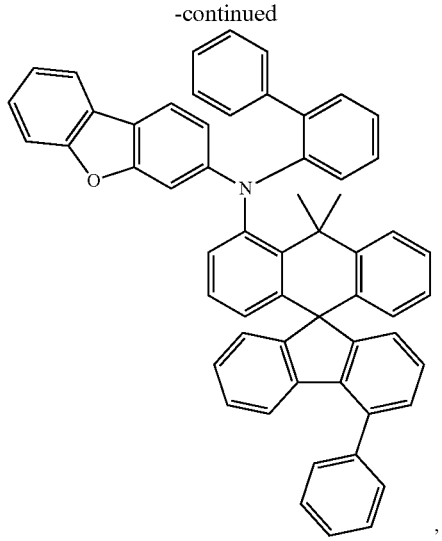
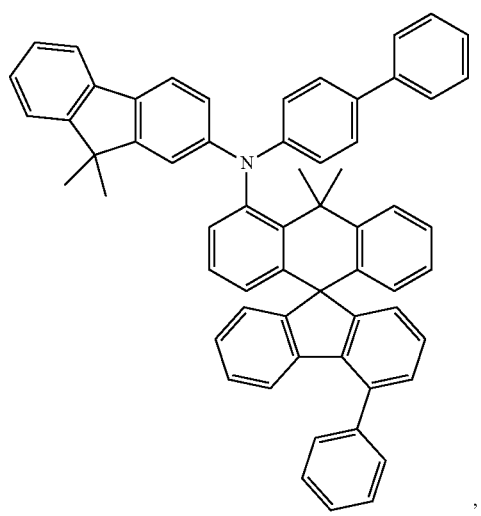
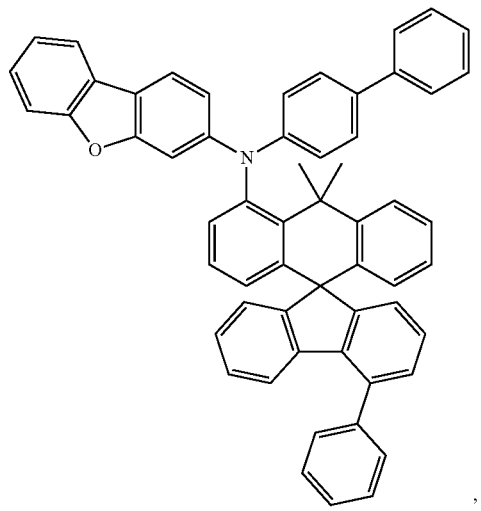
32
-continued
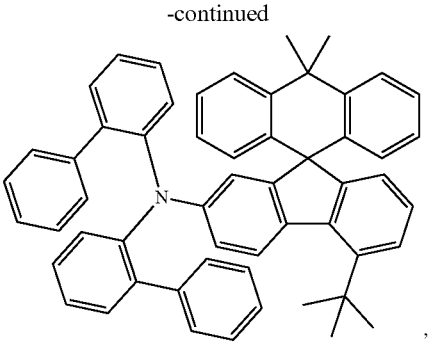
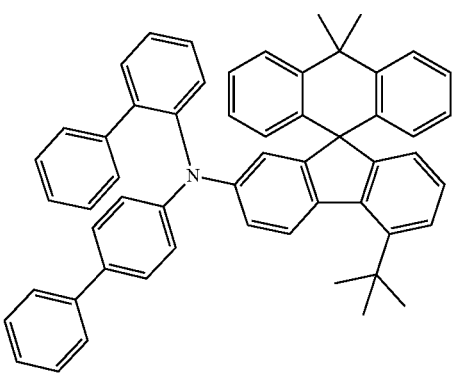
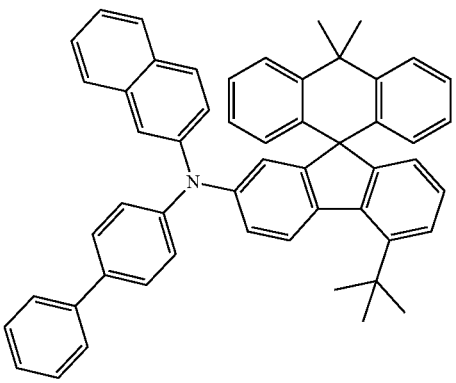
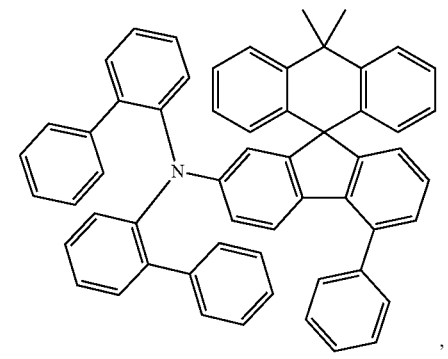

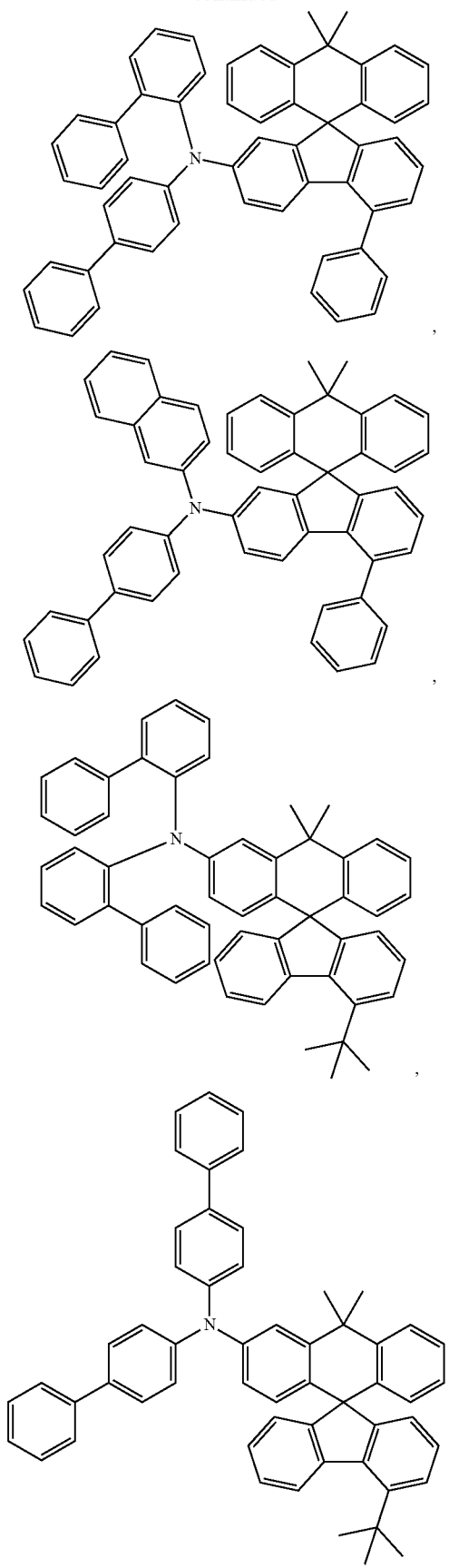
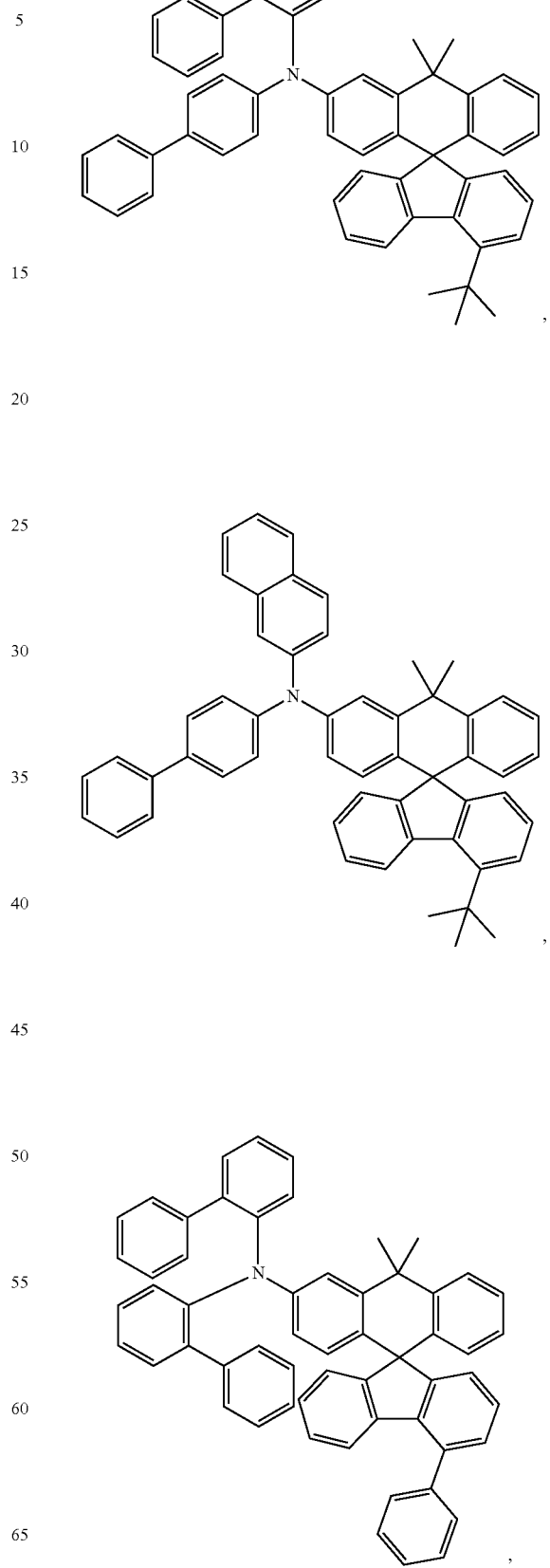

-continued
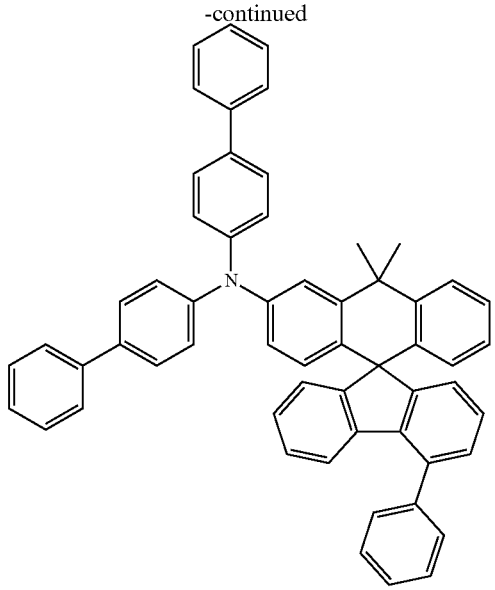
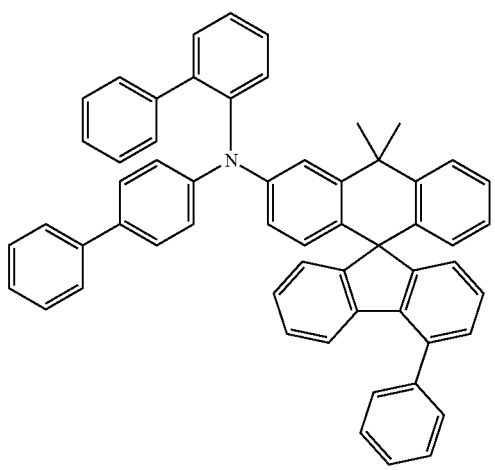
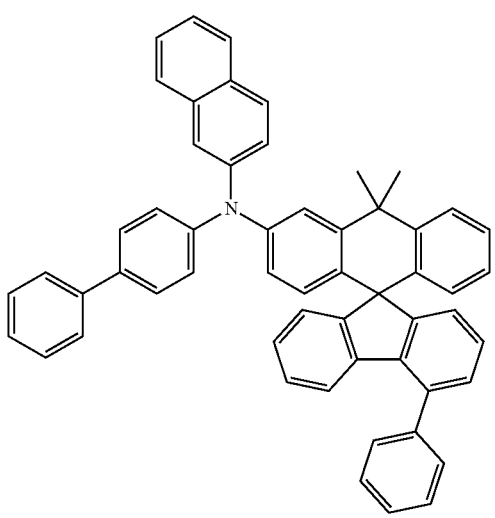
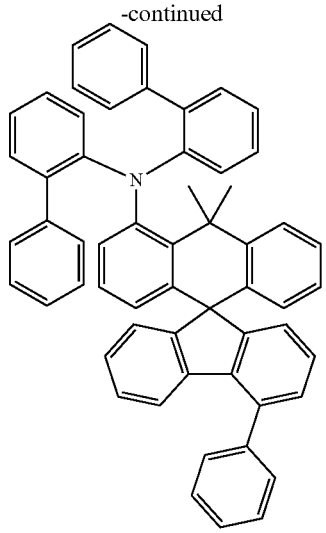
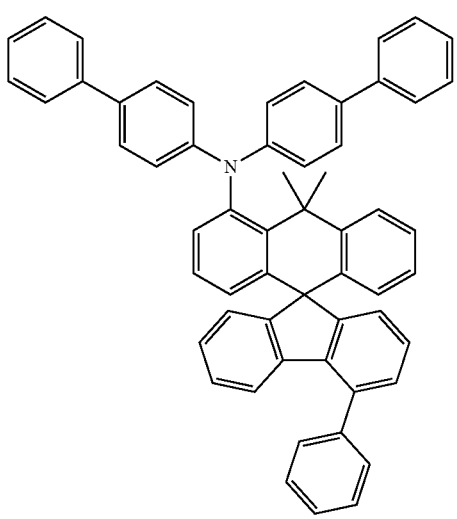
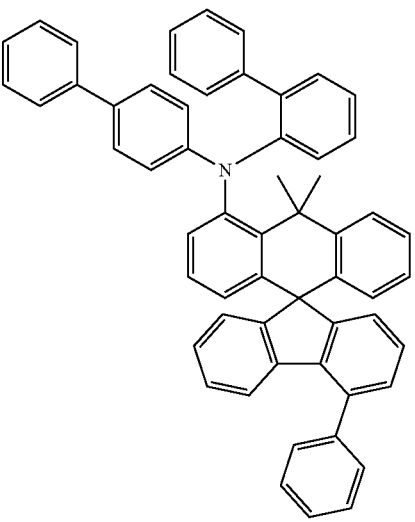

37
-continued
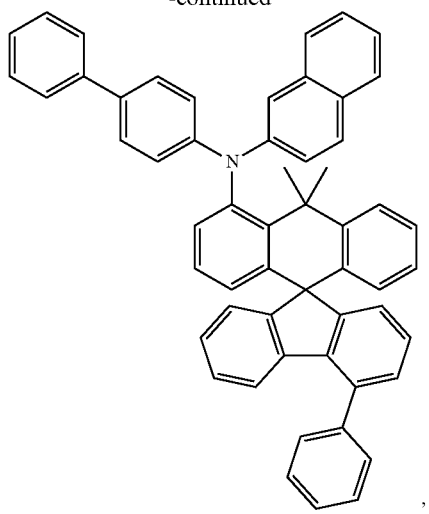
,
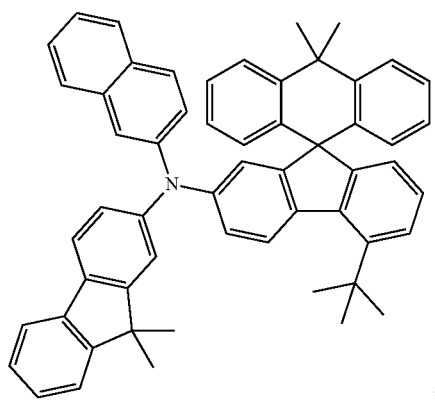
,
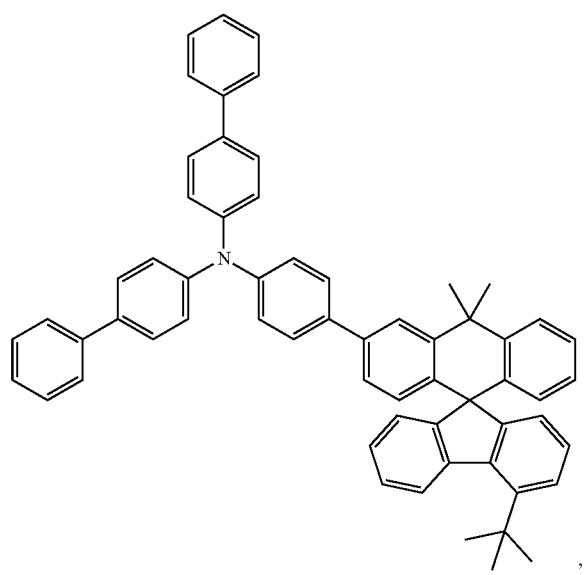
,
38
-continued
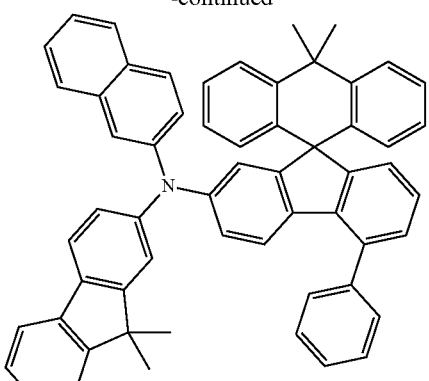
,
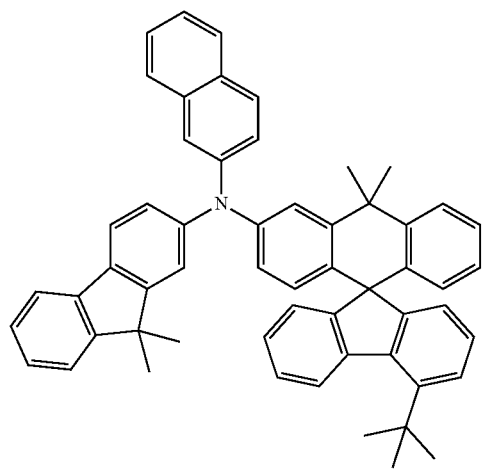
,
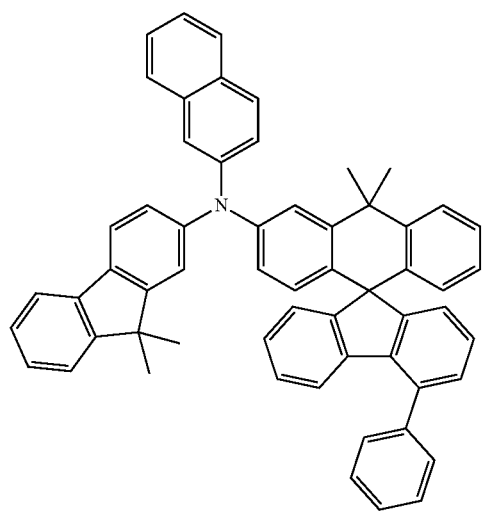
,

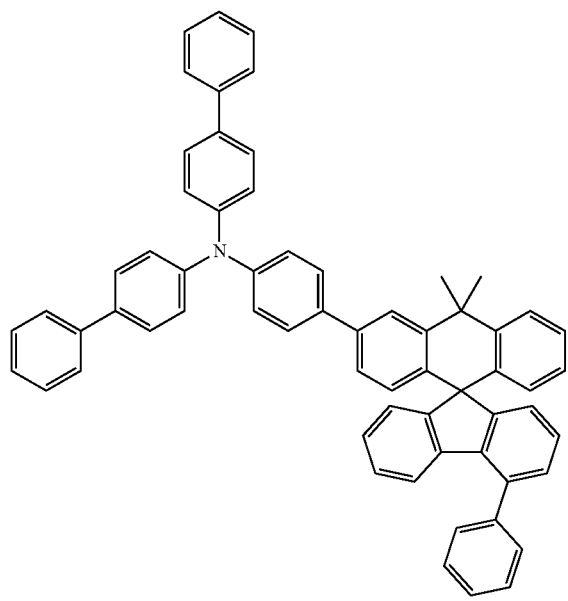
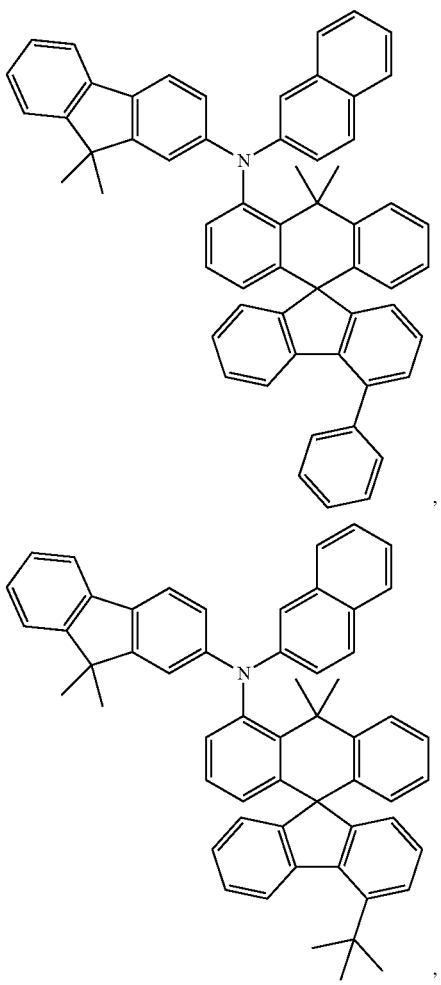
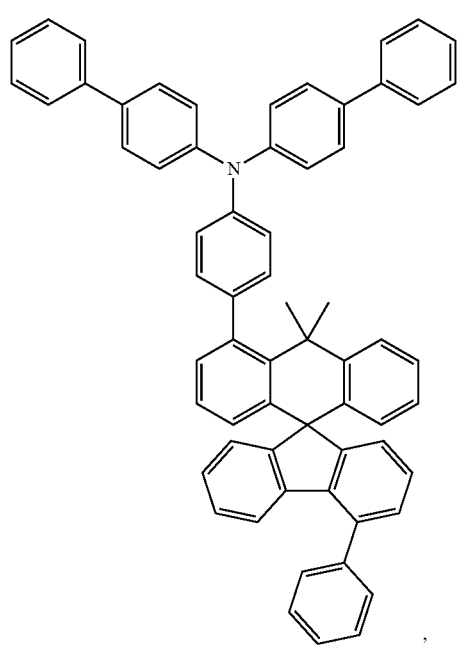
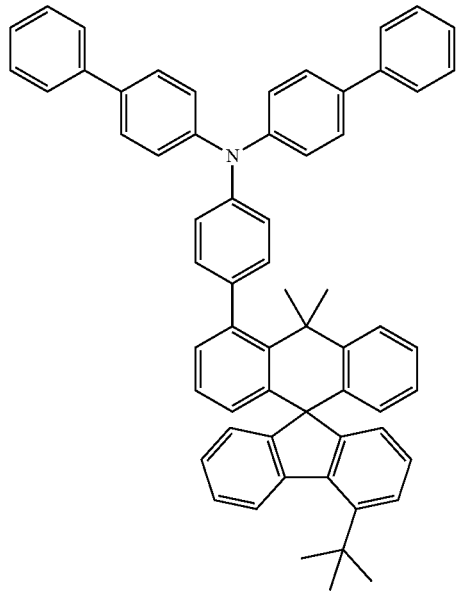

41
-continued
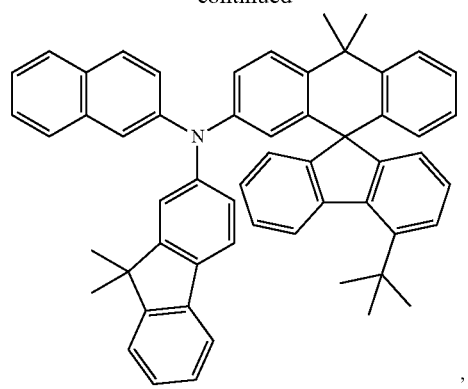
,
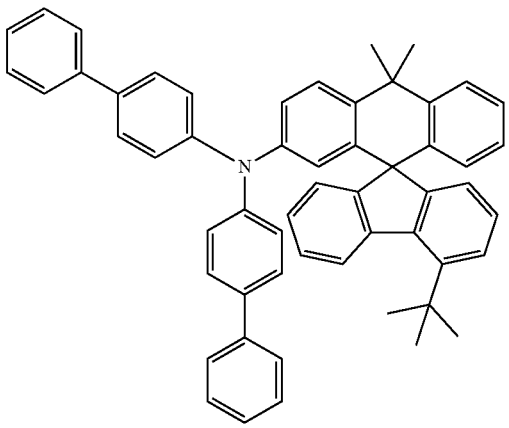
,
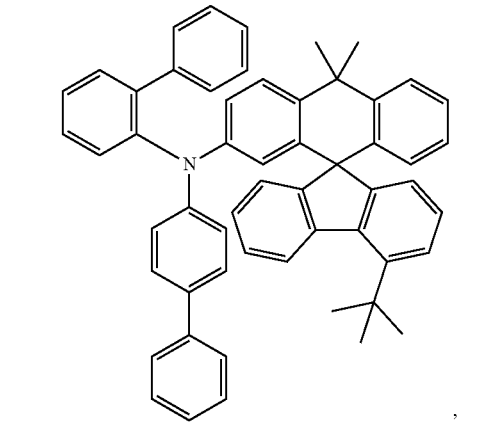
,
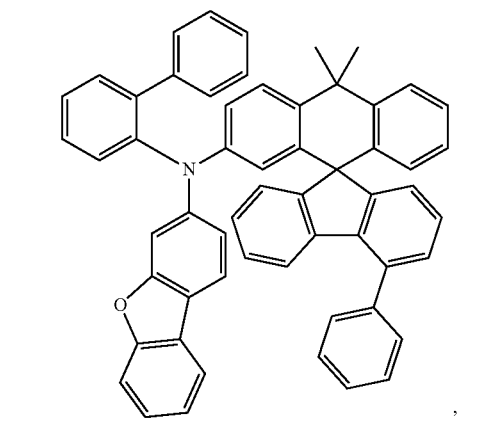
,
42
-continued
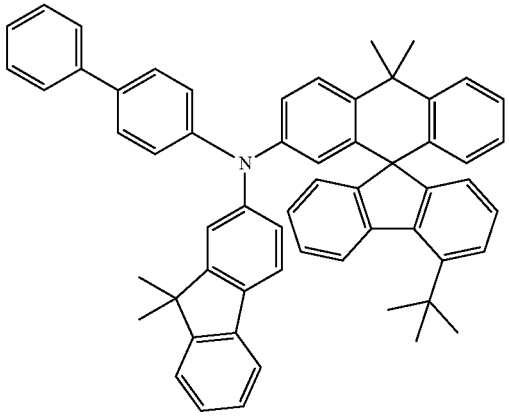
,

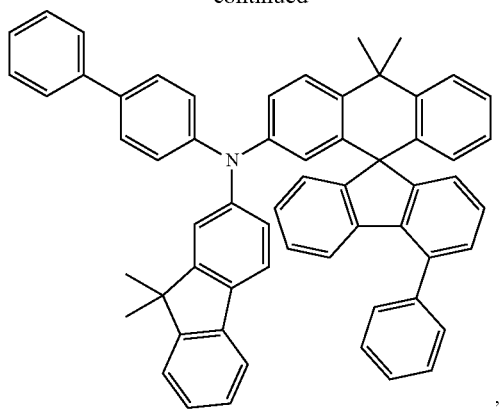
,
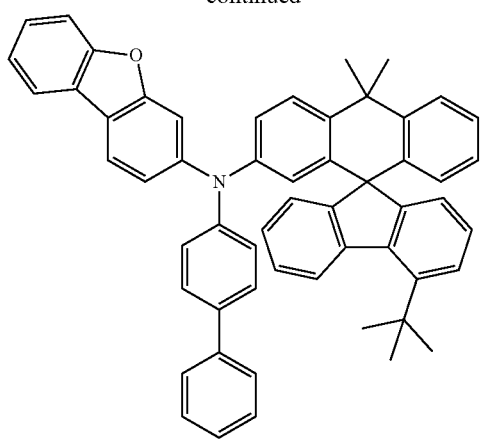
,
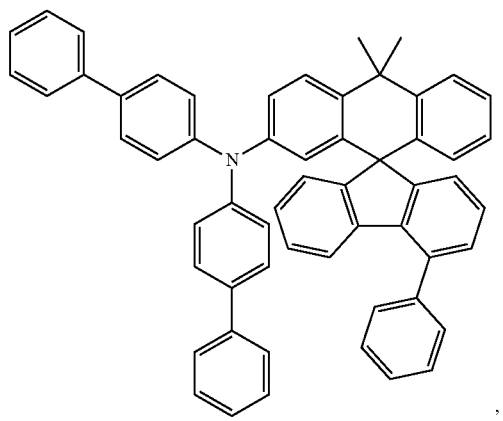
,
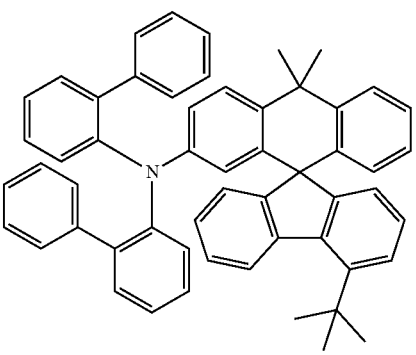
,
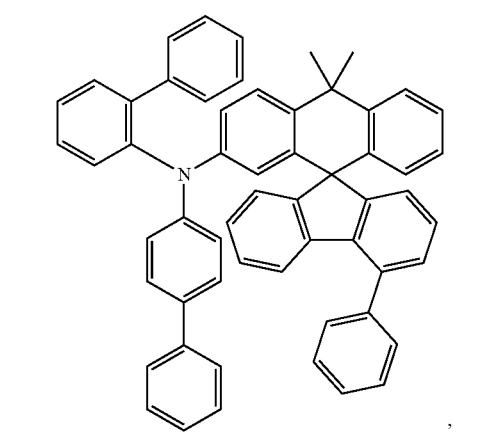
,
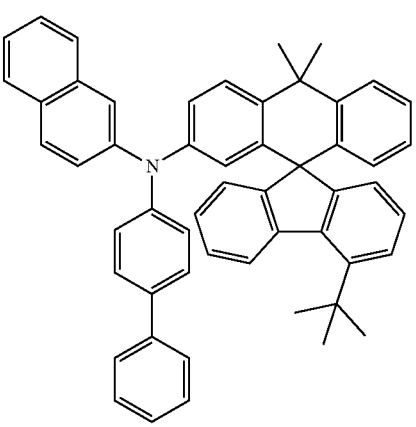
,
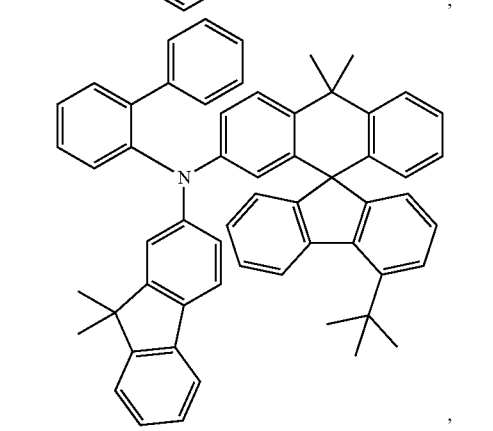
,
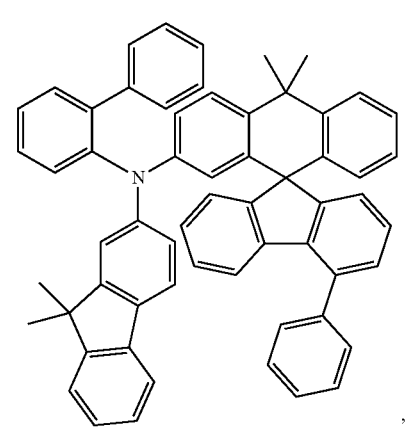
,

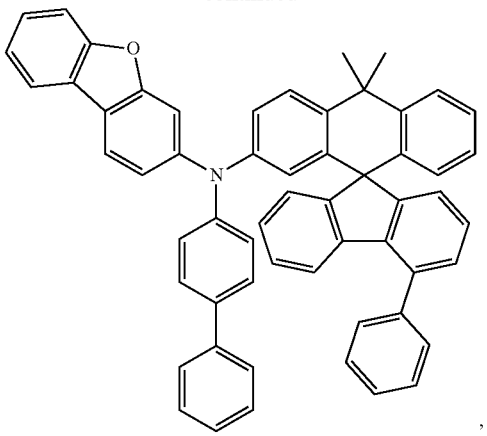

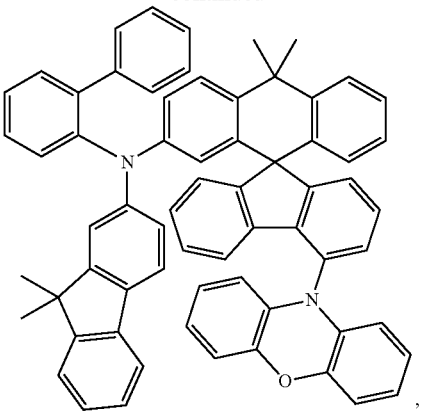

Manufacturing methods of the above hole transport materials are similar to those of the first embodiment, the second embodiment, and the third embodiment, and are not described here. Embodiments, which are based on the embodiments of the present disclosure, obtained by those skilled in the art without making any inventive efforts are within the scope of protection defined by the present disclosure.

Although the present disclosure has been described with reference to specific embodiments, it should be noted that the embodiments are merely examples to show principles and applications of the present disclosure. Therefore, many changes and modifications to the described embodiment can be carried out without departing from the scope and the spirit of the disclosure that is intended to be limited only by the appended claims. It should be noted that dependent claims and features described in the specification may be combined to obtain a new claim which is different from the original independent claims. Furthermore, features described in an independent embodiment may be applied to other embodiments.

What is claimed is:

1. A hole transport material comprising a molecule, wherein a main chain of the molecule comprises a spiro anthracene fluorene structure, and the molecule is represented by a following structural formula:

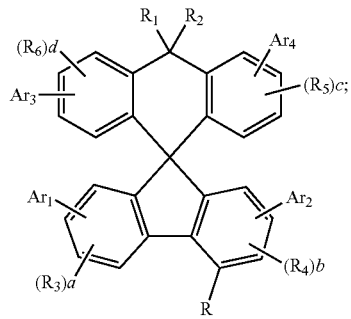

wherein each of $Ar_1$, $Ar_2$, $Ar_3$, and $Ar_4$ is represented by one of following structural formulae:

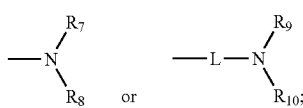

R is selected from a $C_1$-$C_{60}$ alkyl group, a $C_6$-$C_{60}$ aryl group, or a $C_5$-$C_{60}$ heteroaryl group;

$R_1$-$R_6$ are independently selected from hydrogen, deuterium, a $C_6$-$C_{60}$ aryl group, or a $C_5$-$C_{60}$ heteroaryl group;

$R_7$ to $R_{10}$ and L are independently selected from a $C_6$-$C_{60}$ aryl group or a $C_5$-$C_{60}$ heteroaryl group; and a, c, and d are independently selected from an integer from 0 to 3, and b is an integer from 0 to 2.

2. The hole transport material of claim 1, wherein L is represented by one of following group structures:

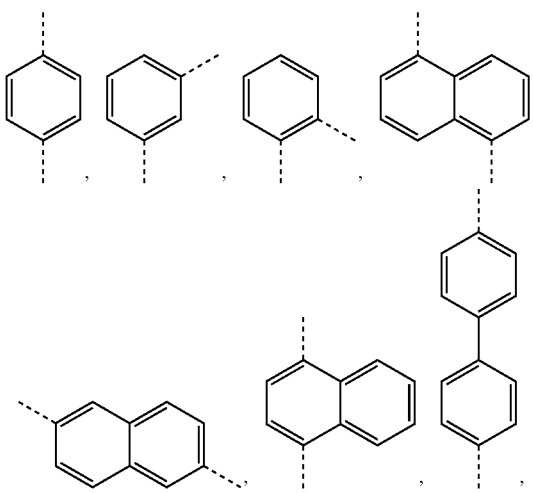

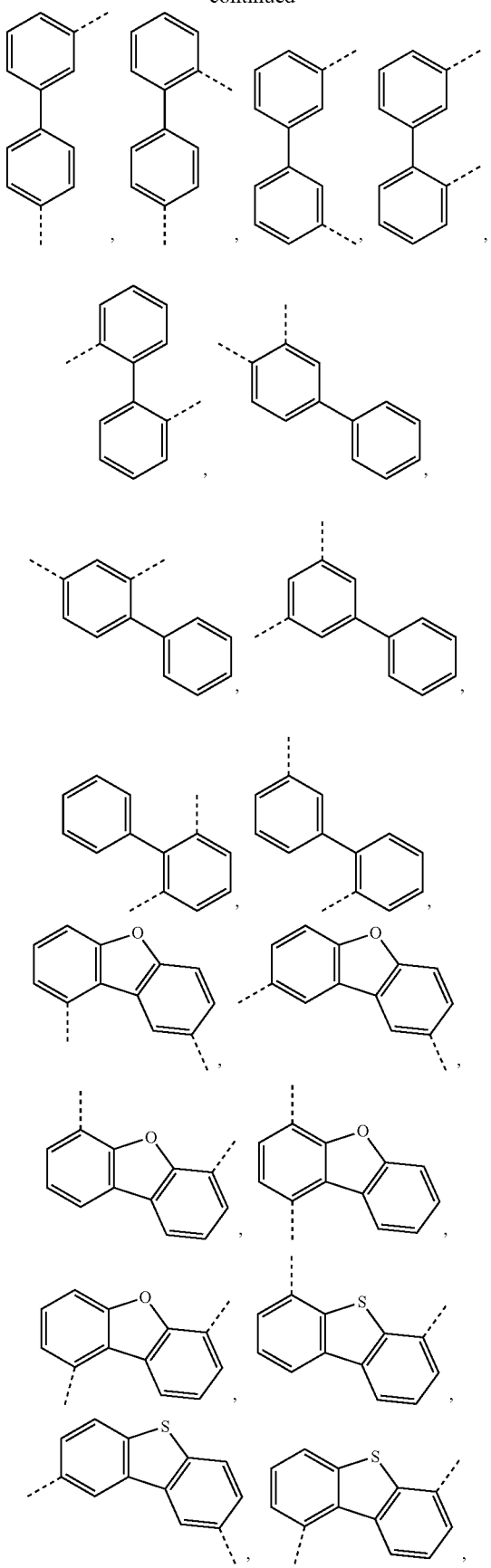

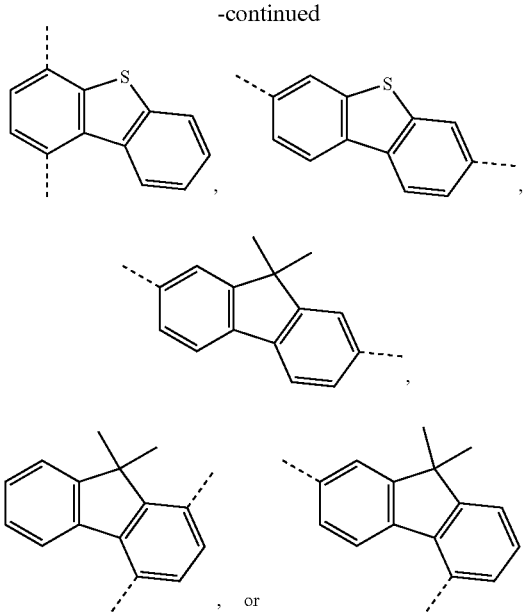, or .

3. The hole transport material of claim 1, wherein when a, c, and d are independently selected from an integer from 1 to 3, and b is an integer from 1 to 2, $R_3$-$R_6$ are independently selected from a $C_1$-$C_{60}$ alkyl group, a $C_6$-$C_{60}$ aryl group, or a $C_5$-$C_{60}$ heteroaryl group.

4. A hole transport material, wherein the hole transport material is represented by any one of following structural formulae:

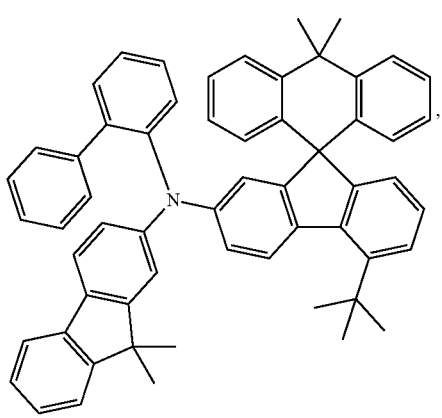,

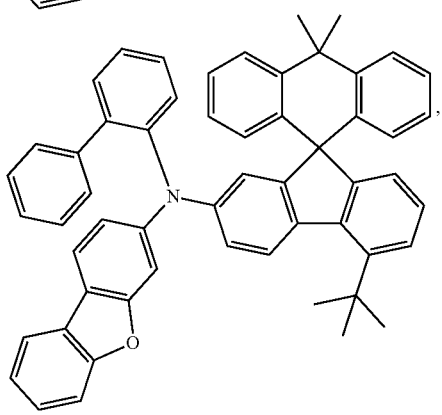,

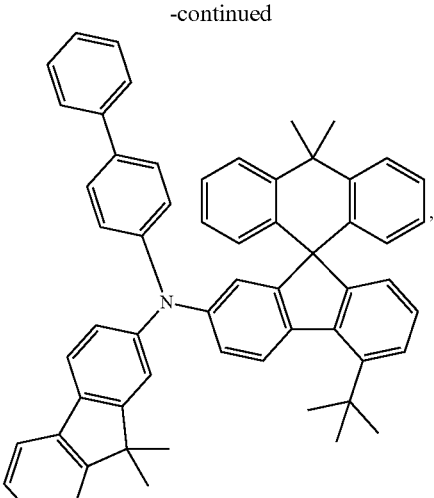,

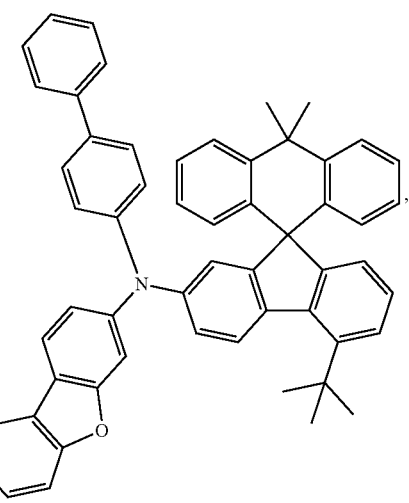,

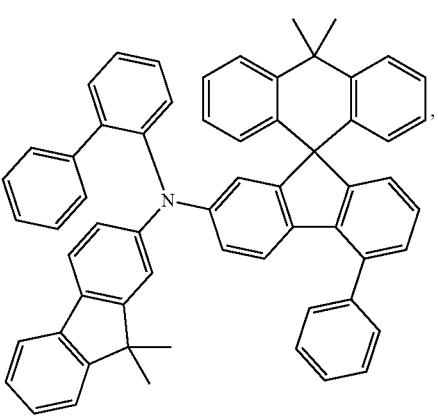,

51
-continued
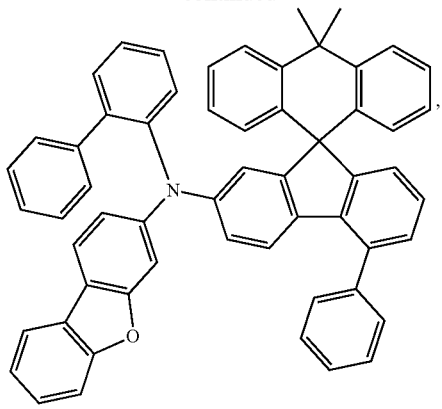
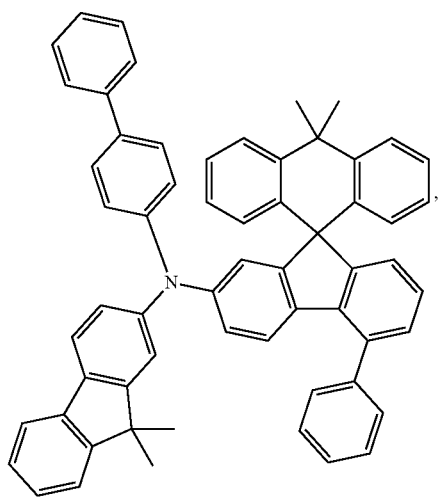
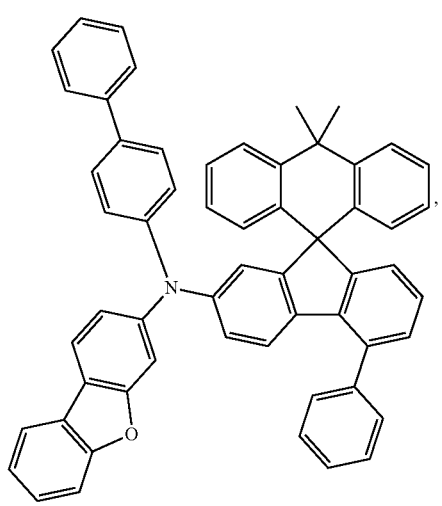
52
-continued
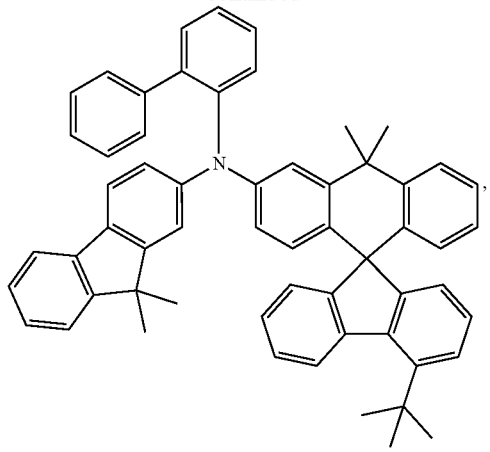
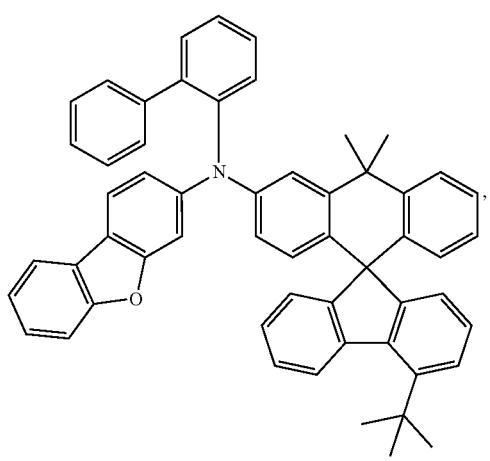
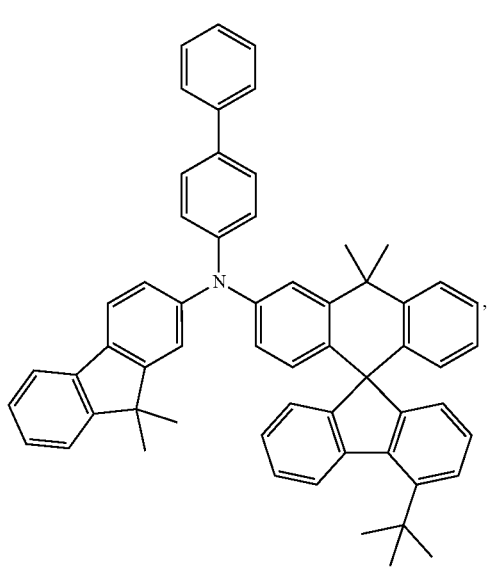 [SMILES: CC(C)(C)c1cccc2c1-c1ccccc1C21c2ccccc2C(C)(C)c2cc(N(c3ccc(-c4ccccc4)cc3)c3ccc4c(c3)oc3ccccc34)ccc21]

-continued
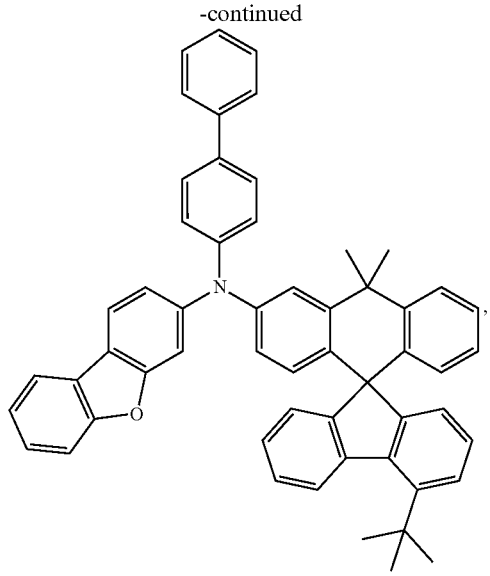
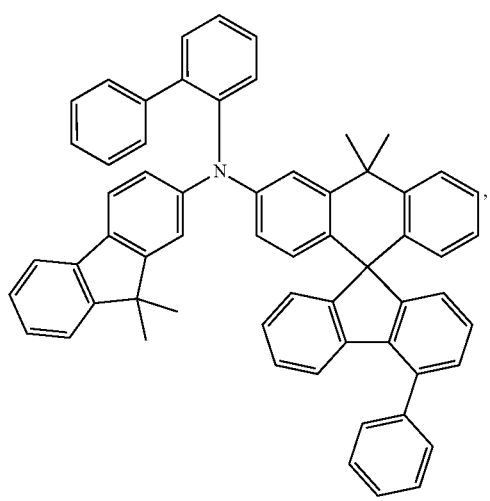
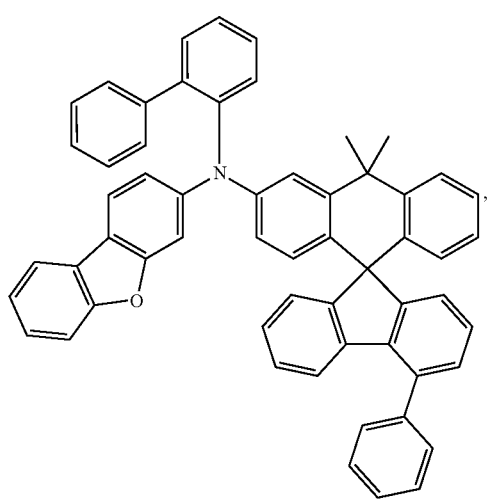
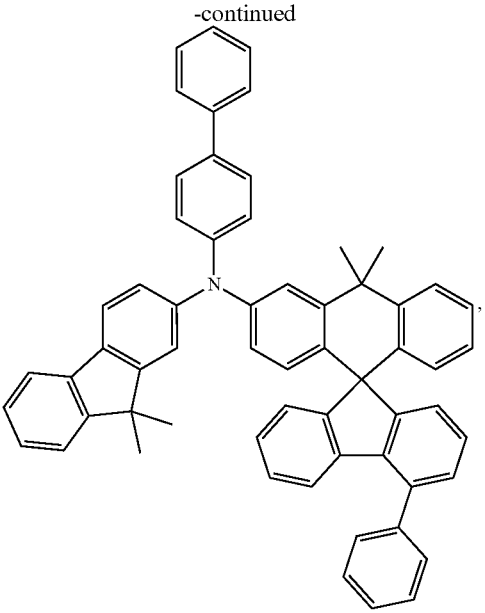
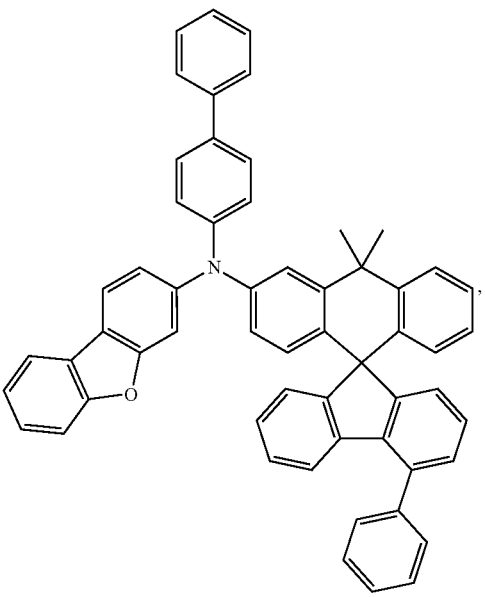

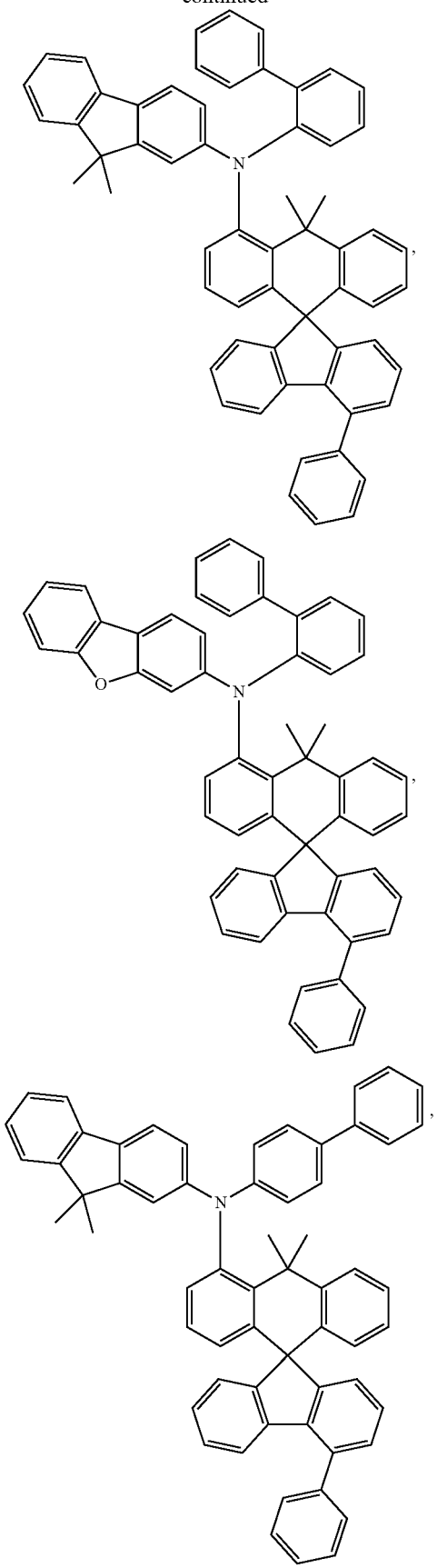
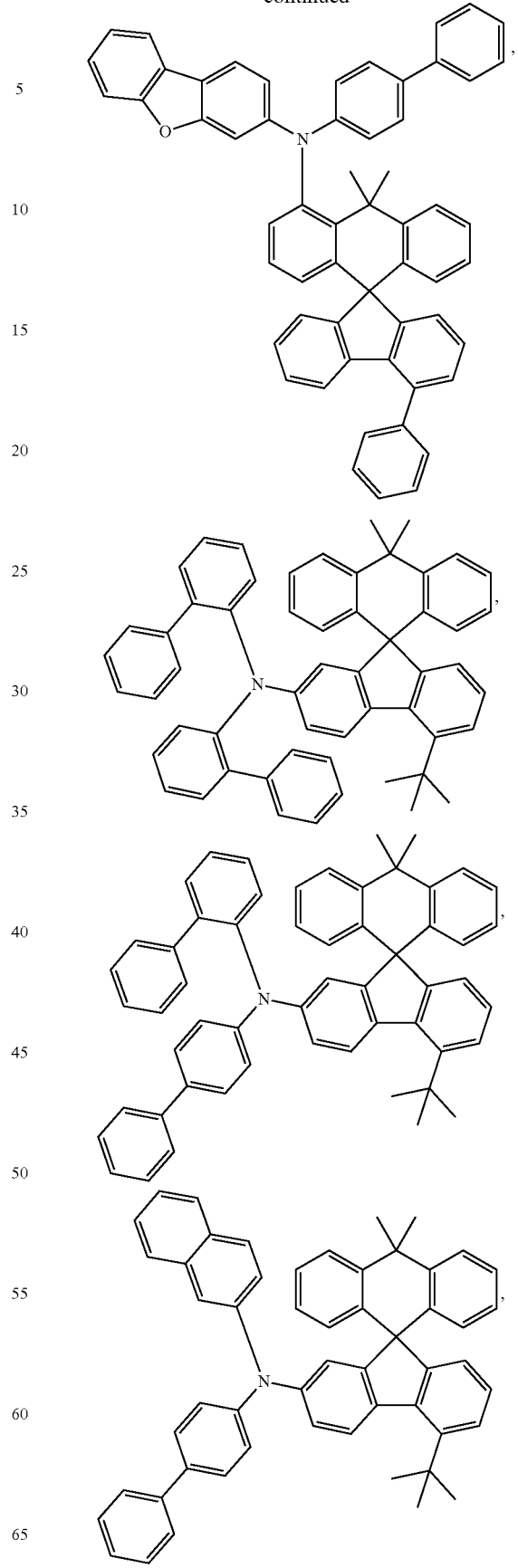

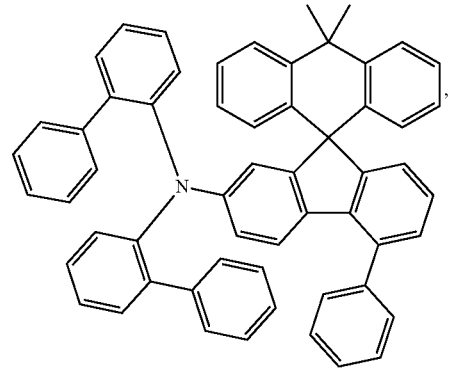
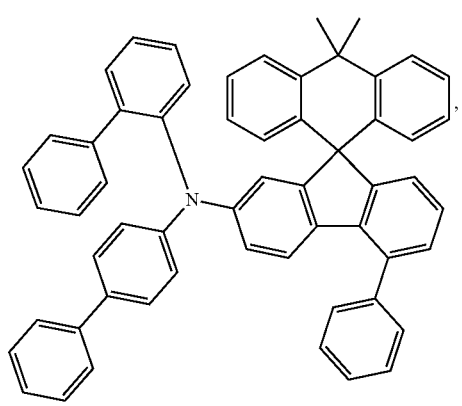
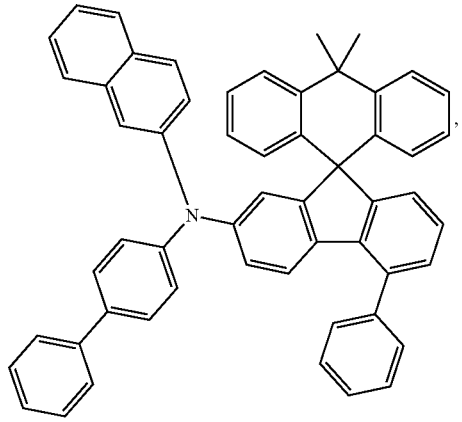
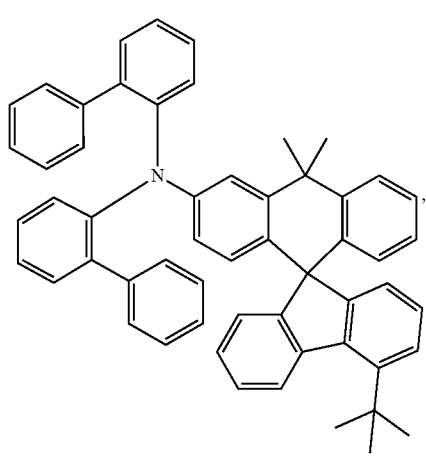
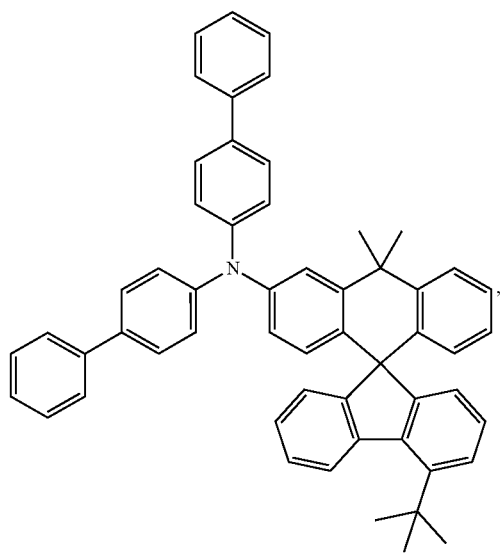
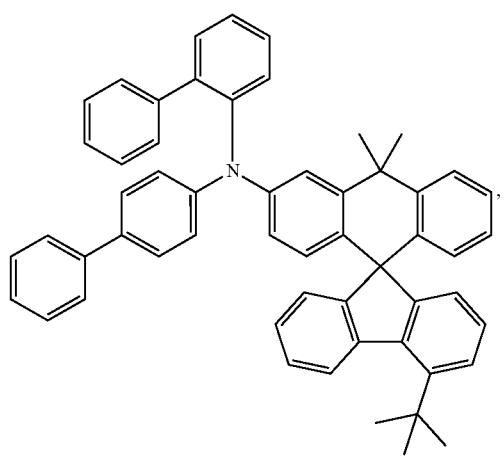
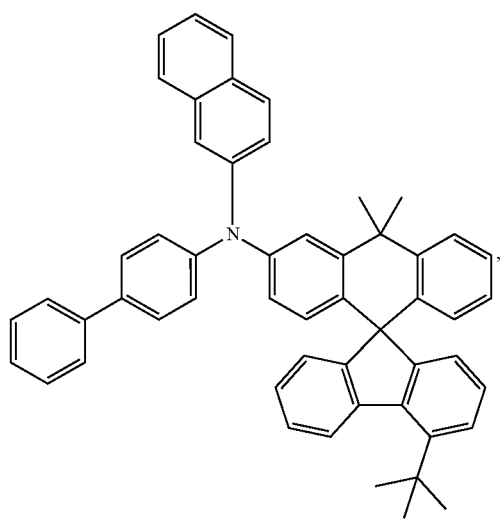

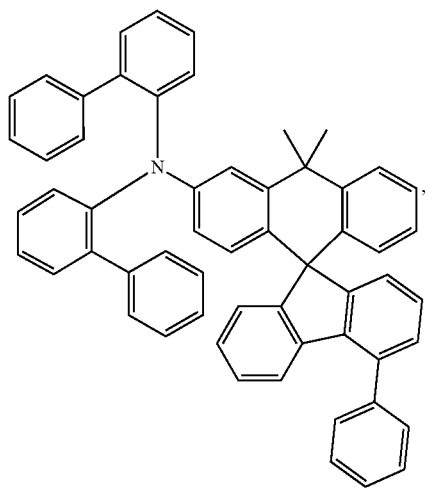
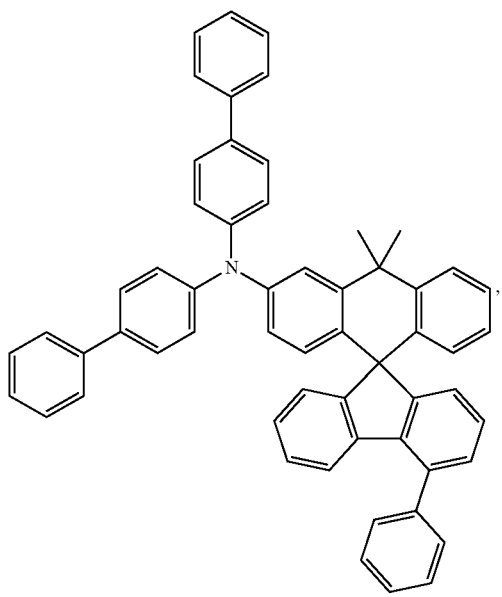
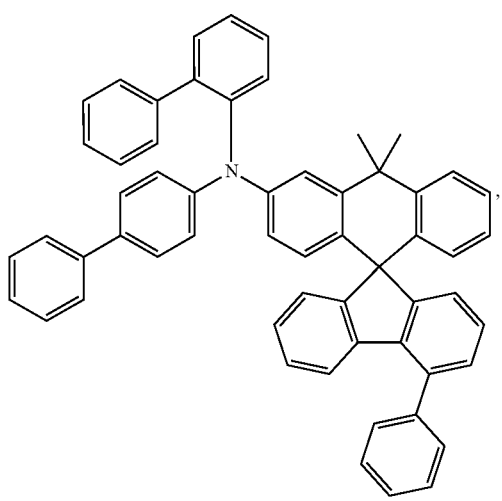
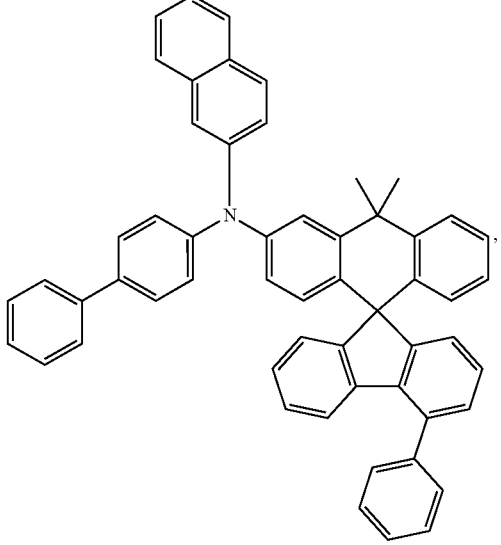
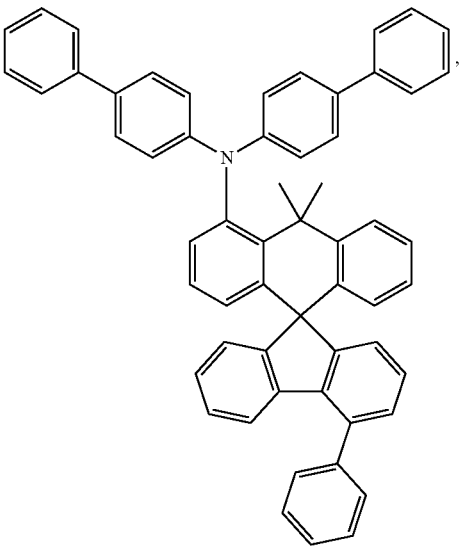

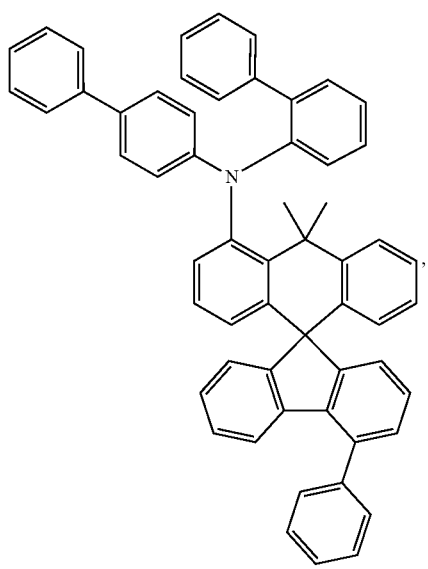
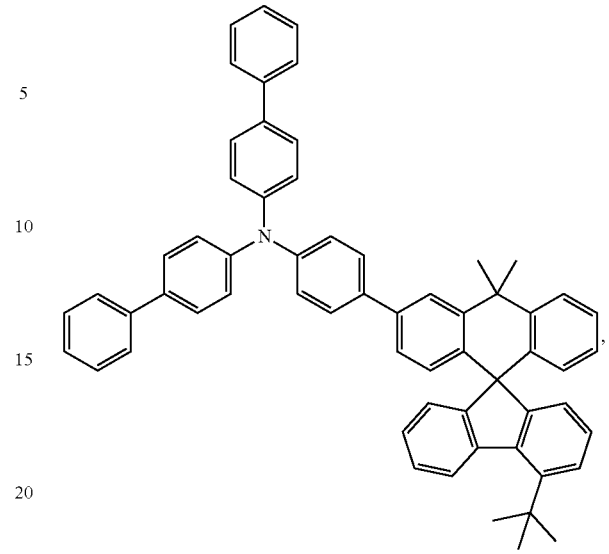
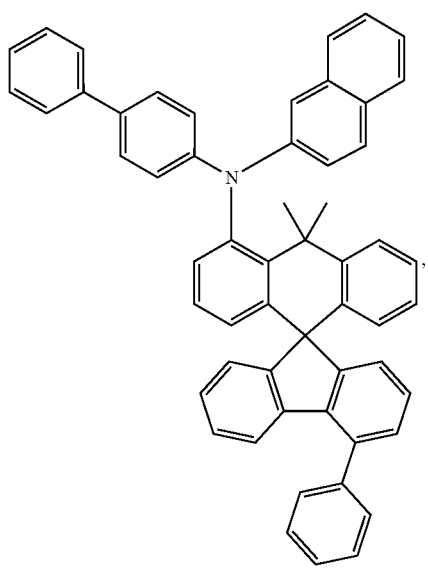
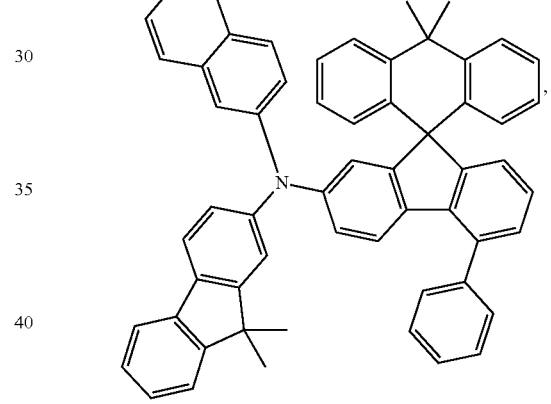
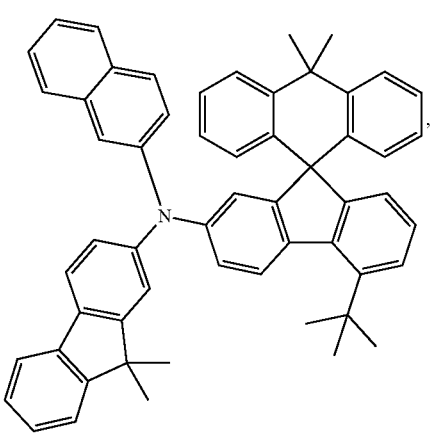
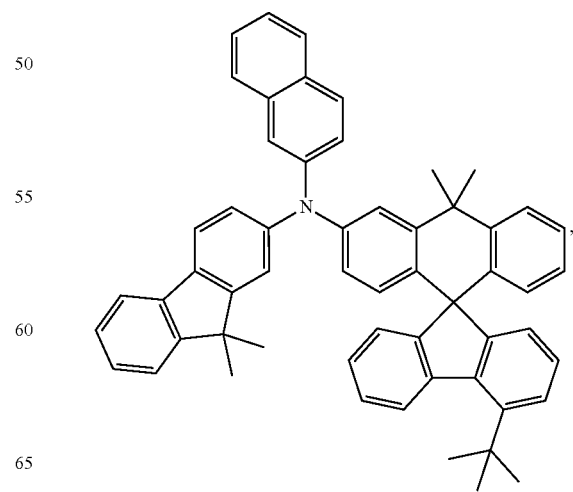

63
-continued
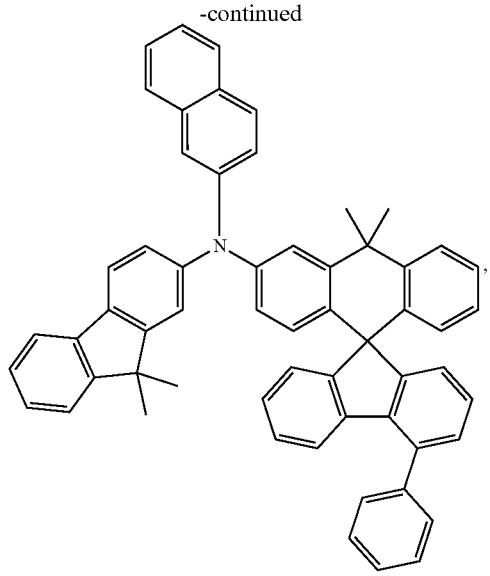
64
-continued
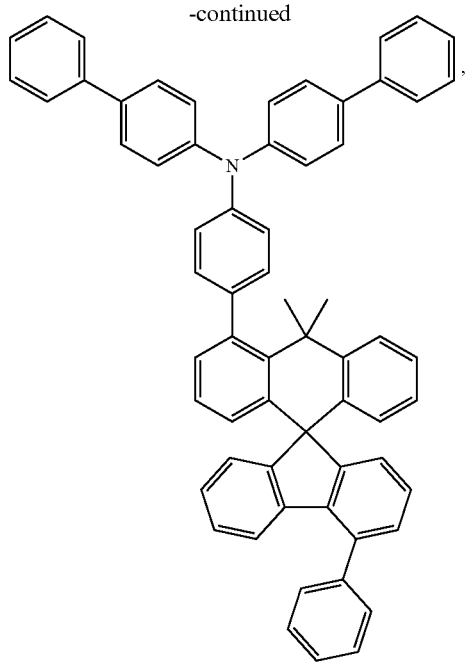
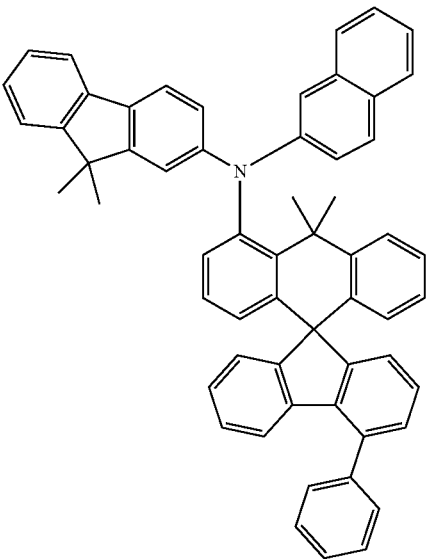
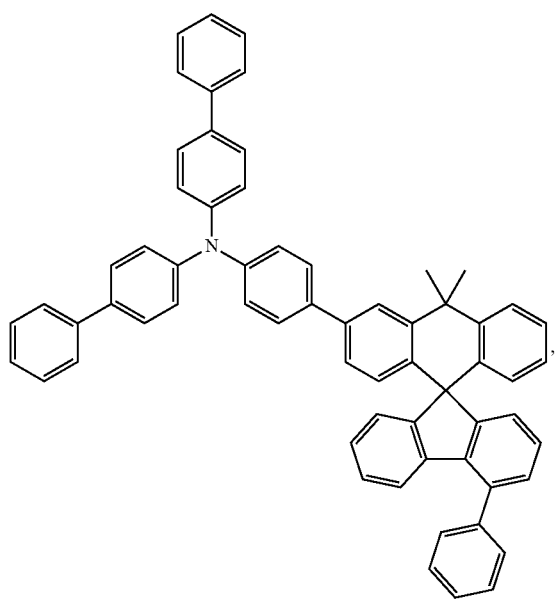

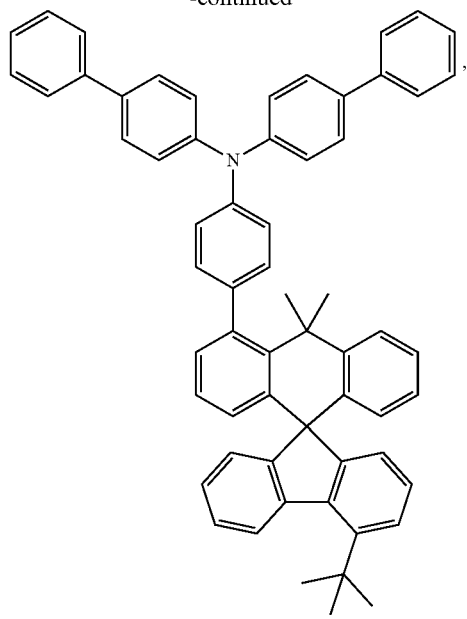
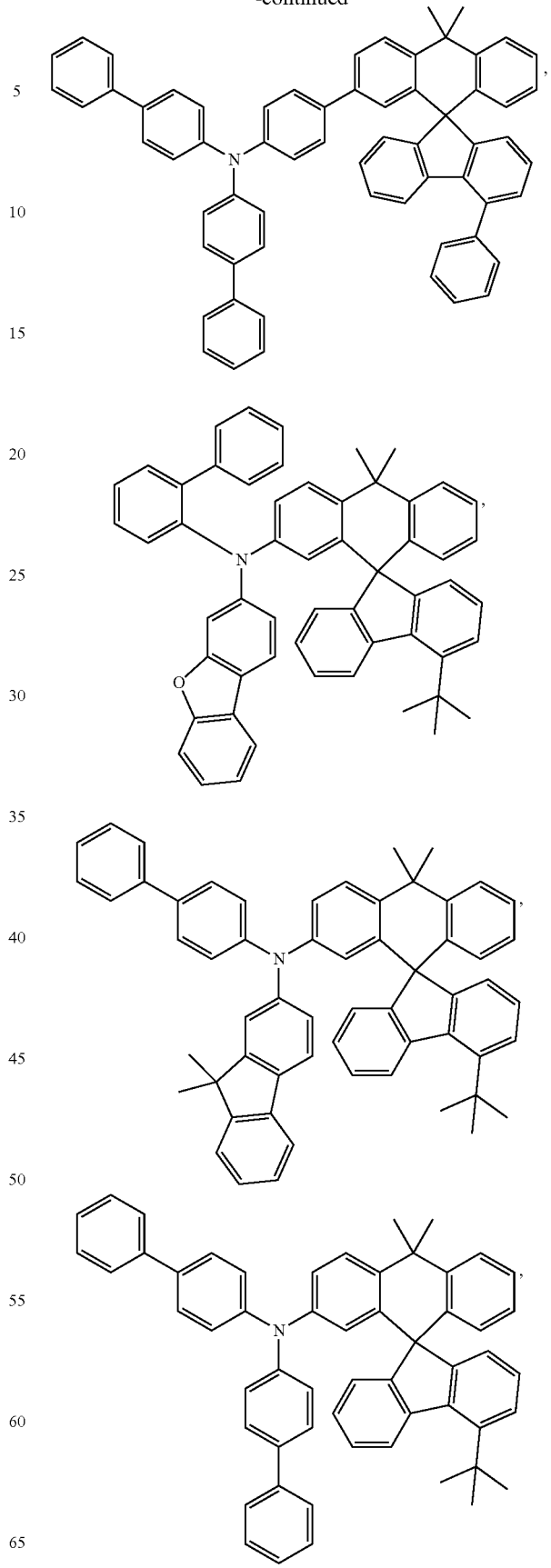

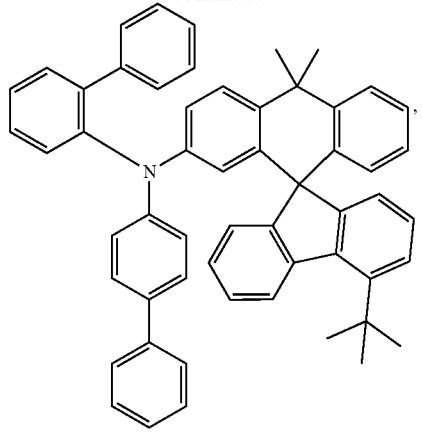
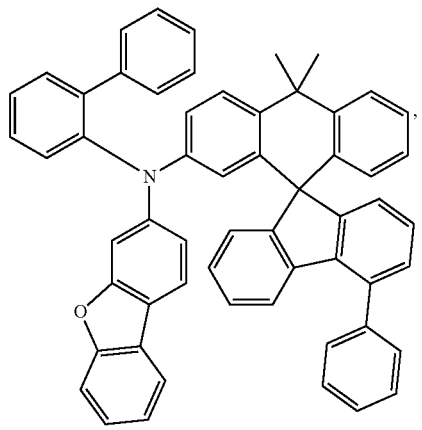
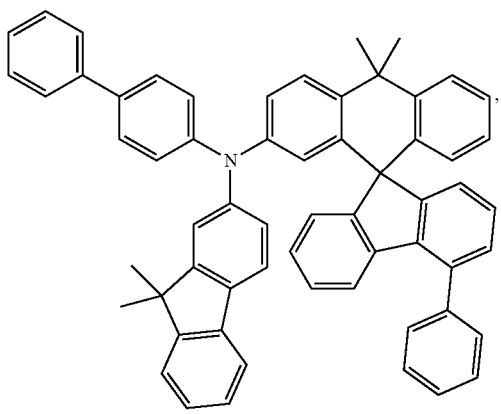
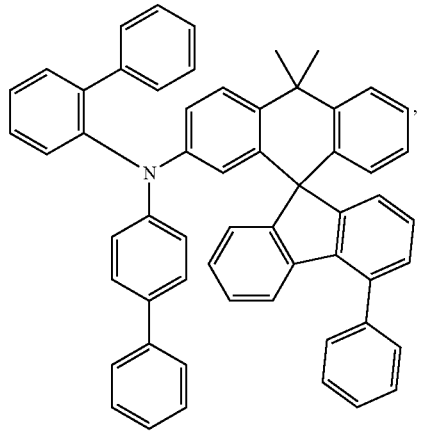
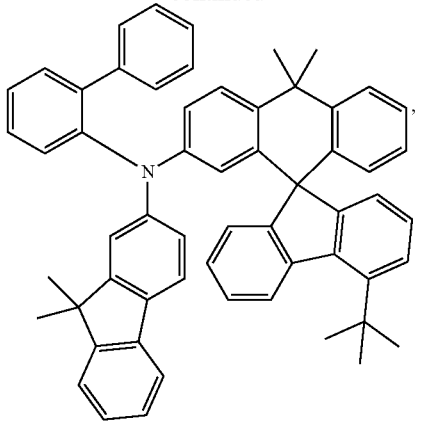
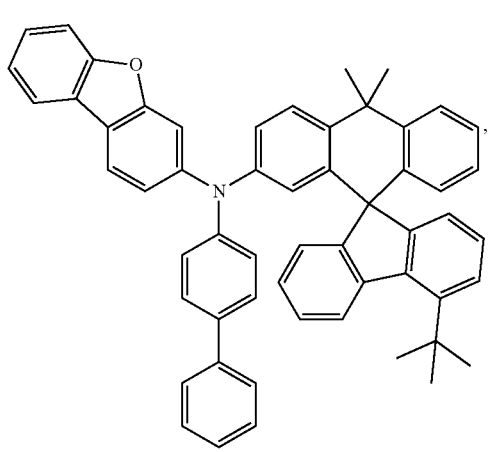
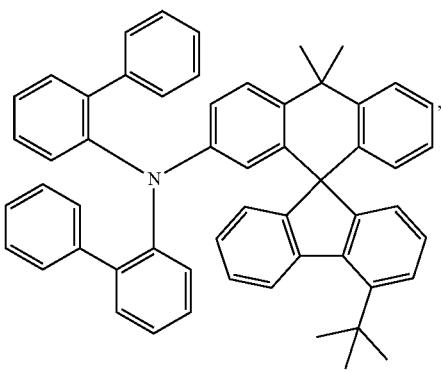
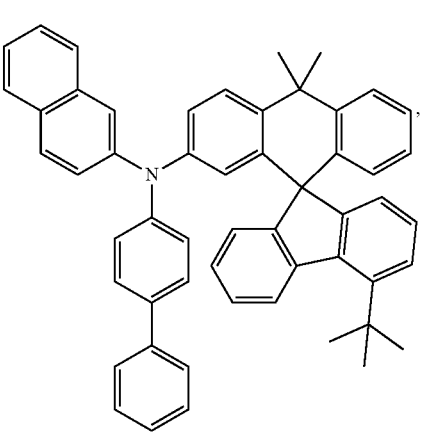

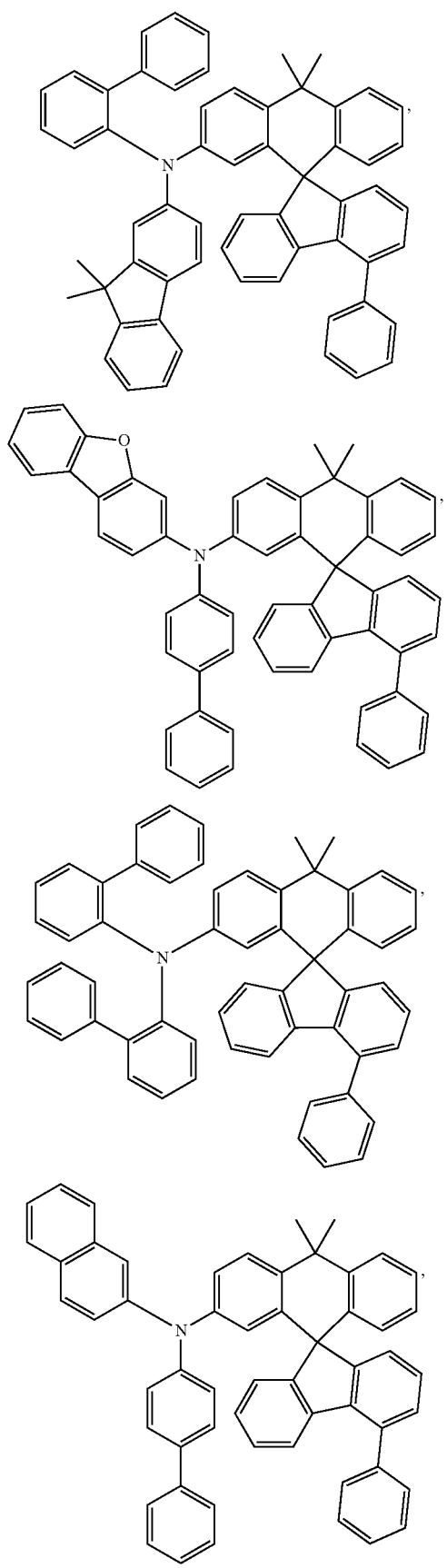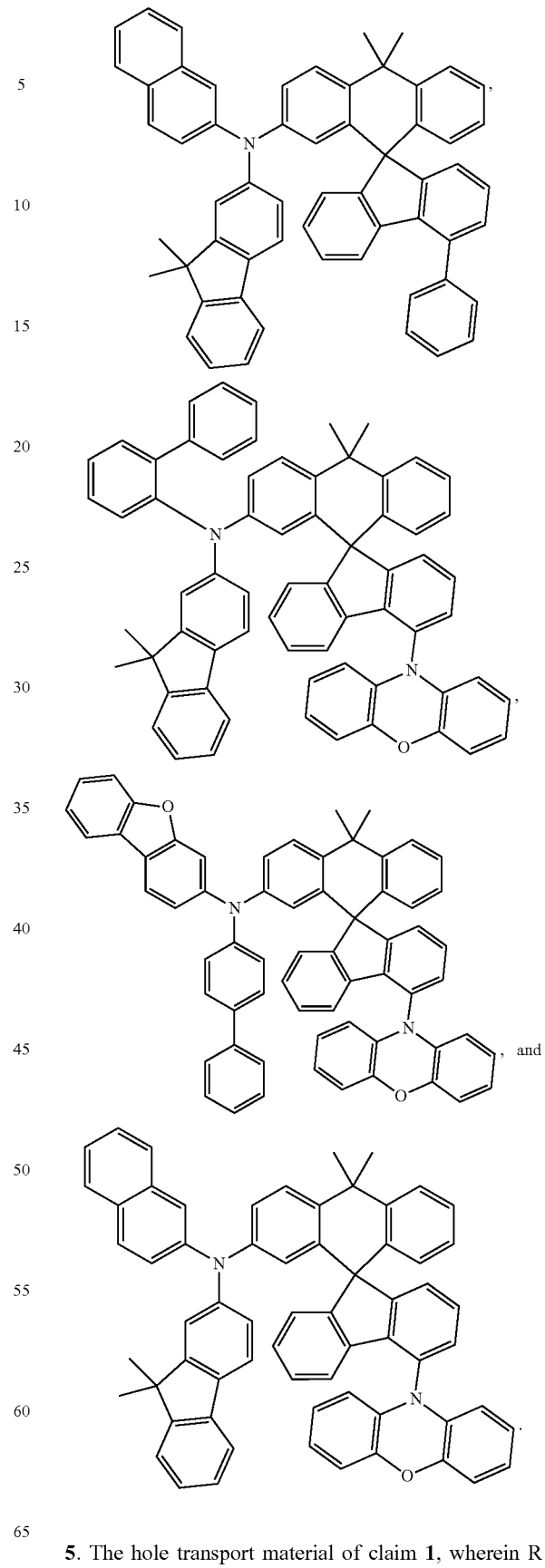
5. The hole transport material of claim 1, wherein R is represented by one of following group structures:

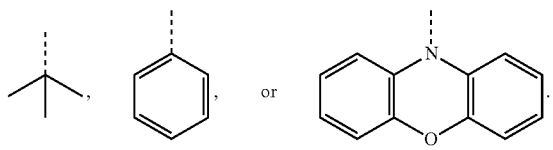

6. A method of manufacturing a hole transport material, comprising following steps:

manufacturing a first compound, wherein the first compound comprises a following molecular structure:

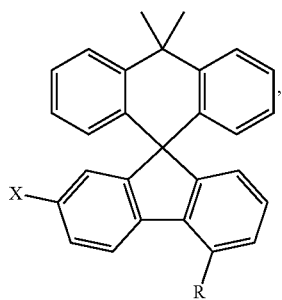

wherein R is selected from a $C_1$-$C_{60}$ alkyl group, a $C_6$-$C_{60}$ aryl group, or a $C_5$-$C_{60}$ heteroaryl group, and X is one of halogen elements;

synthesizing a first target compound: performing a deoxidation process on the first compound and a second compound in a reaction vessel, adding a catalyst into the reaction vessel, and completely reacting the first compound with the second compound at a temperature ranging from 50° C. to 150° C. to obtain a first solution, wherein the second compound comprises at least one of an aryl group or a heteroaryl group; and performing a purification process on the first target compound: purifying the first solution by a silica gel column chromatography method with an eluent to obtain the hole transport material;

wherein the hole transport material comprises a molecule, wherein a main chain of the molecule comprises a spiro anthracene fluorene structure, and the molecule is represented by a following structural formula:

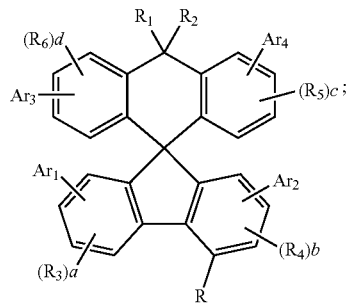

wherein each of $Ar_1$, $Ar_2$, $Ar_3$, and $Ar_4$ is represented by one of following structural formulae:

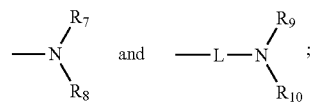

R is selected from a $C_1$-$C_{60}$ alkyl group, a $C_6$-$C_{60}$ aryl group, or a $C_5$-$C_{60}$ heteroaryl group;

$R_1$-$R_6$ are independently selected from hydrogen, deuterium, a $C_6$-$C_{60}$ aryl group, or a $C_5$-$C_{60}$ heteroaryl group;

$R_7$ to $R_{10}$ and L are independently selected from a $C_6$-$C_{60}$ aryl group or a $C_5$-$C_{60}$ heteroaryl group; and a, c, and d are independently selected from an integer from 0 to 3, and b is an integer from 0 to 2.

7. The method of claim 6, wherein the step of manufacturing the first compound further comprises following steps:

manufacturing a third compound, wherein the third compound comprises a following molecular structure:

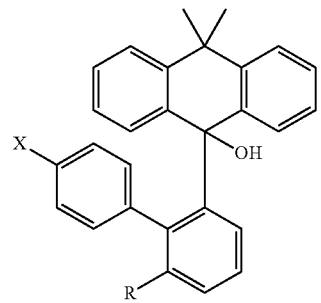

synthesizing a second target compound: completely reacting the third compound with a concentrated hydrochloric acid and a glacial acetic acid in a reaction vessel at a temperature ranging from 50° C. to 100° C., and adding sodium bicarbonate into the reaction vessel to obtain a second solution, wherein the second solution comprises the second target compound;

extracting the second target compound: adding dichloromethane into the second solution to extract the second target compound; and performing a purification process on the second target compound: purifying the second target solution by a silica gel column chromatography method with an eluent to obtain the second compound.

8. The method of claim 7, wherein the step of manufacturing the third compound comprises a following step:

dissolving a fourth compound into tetrahydrofuran, adding butyl lithium into the tetrahydrofuran to obtain a reaction solution after a reaction, dripping tetrahydrofuran dissolved with a fifth compound into the reaction solution to obtain a third solution after a complete reaction, and removing liquid from the third solution to obtain a third compound;

wherein the fourth compound comprises a following molecular structure:

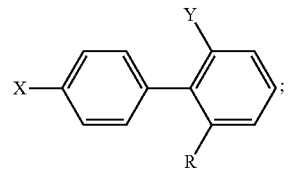

Y is a halogen element; and the fifth compound comprises an anthracene structure.

9. An electroluminescent device comprising:

a substrate layer;

a first electrode disposed on the substrate layer;

a hole injection layer disposed on the first electrode;

a hole transport layer disposed on the hole injection layer;

a luminescent layer disposed on the hole transport layer;

an electron transport layer disposed on the luminescent layer;

an electron injection layer disposed on the electron transport layer; and a second electrode disposed on the electron injection layer;

wherein the hole transport layer comprises a hole transport material comprising the molecule as claimed in claim 1, wherein a main chain of the molecule comprises a spiro anthracene fluorene structure

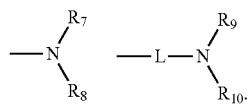

10. The electroluminescent device of claim 9, wherein L is represented by one of following group structures:

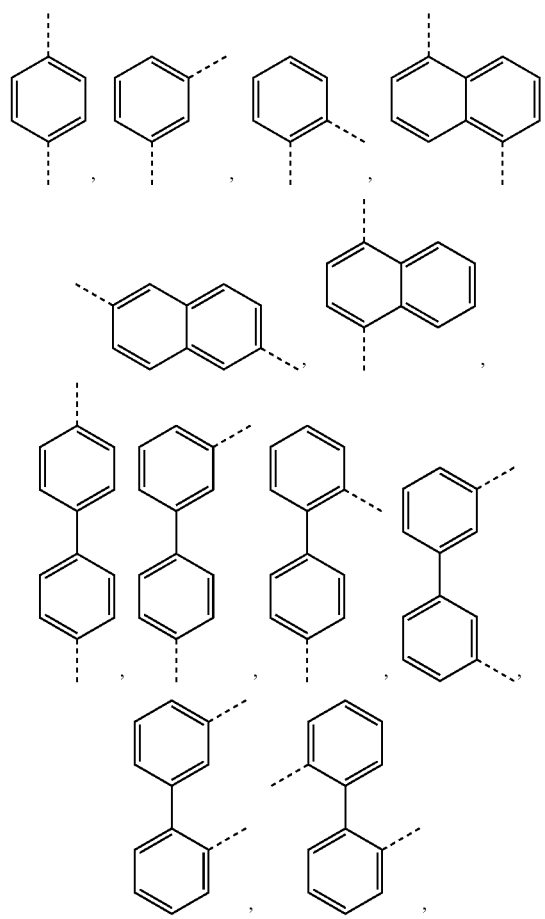

-continued

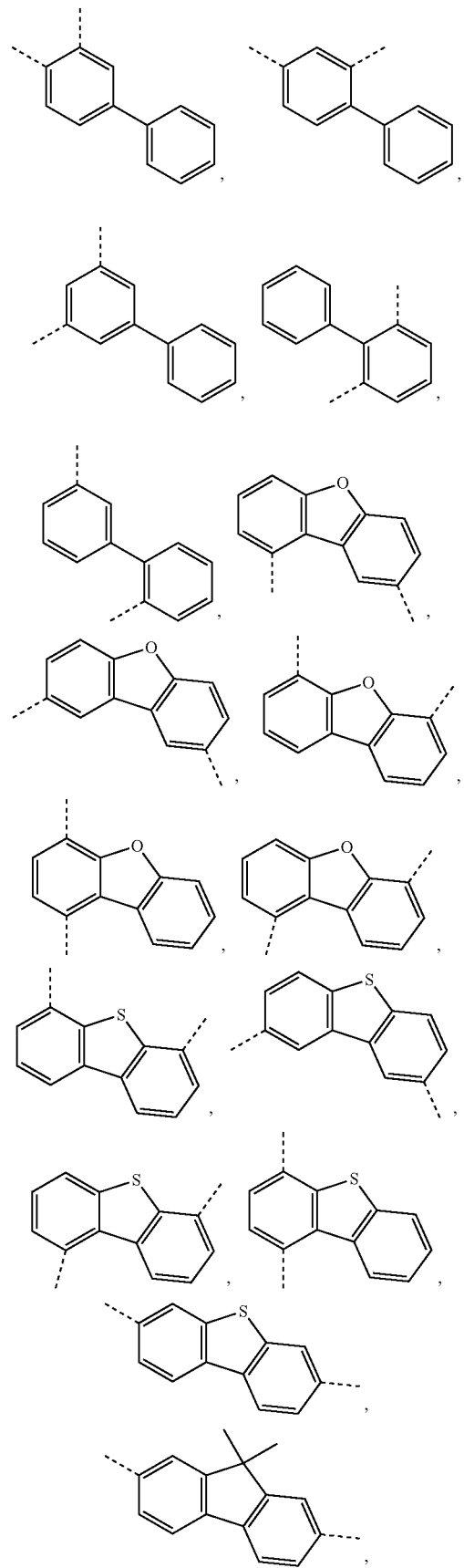

-continued

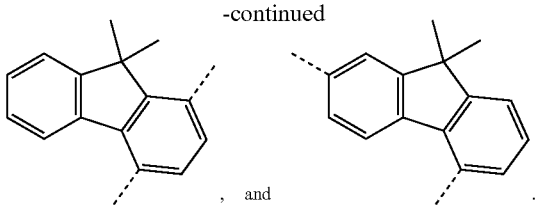

, and .

11. The electroluminescent device of claim 9, wherein when a, c, and d are independently selected from an integer from 1 to 3, and b is an integer from 1 to 2, $R_3$-$R_6$ are independently selected from a $C_1$-$C_{60}$ alkyl group, a $C_6$-$C_{60}$ aryl group, or a $C_5$-$C_{60}$ heteroaryl group.

12. The electroluminescent device of claim 9, wherein the hole transport material is represented by the following structural formula:

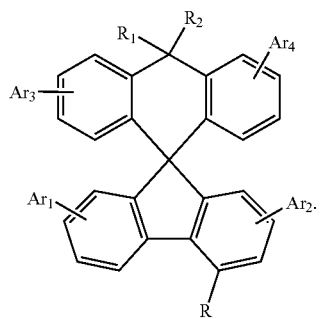

13. The electroluminescent device of claim 9, R is represented by one of following group structures:

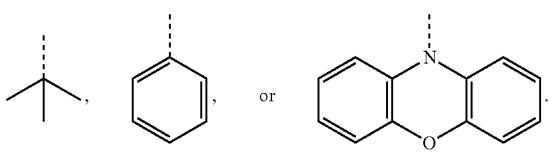

14. The hole transport material of claim 1, wherein the hole transport material is represented by the following structural formula:

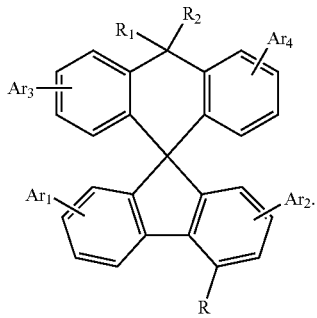

* * * * *